(12) United States Patent
Iijima

(10) Patent No.: US 7,681,055 B2
(45) Date of Patent: Mar. 16, 2010

(54) CONTROL DEVICE AND METHOD FOR A SUBSTRATE PROCESSING APPARATUS

(75) Inventor: Kiyohito Iijima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 554 days.

(21) Appl. No.: 11/683,090

(22) Filed: Mar. 7, 2007

(65) Prior Publication Data

US 2007/0213864 A1 Sep. 13, 2007

Related U.S. Application Data

(60) Provisional application No. 60/782,617, filed on Mar. 16, 2006.

(30) Foreign Application Priority Data

Mar. 8, 2006 (JP) ............................. 2006-062666

(51) Int. Cl.
*G06F 1/26* (2006.01)
*G06F 19/00* (2006.01)
(52) U.S. Cl. .......................... 713/320; 700/90; 700/121
(58) Field of Classification Search ................. 713/320; 700/90, 108, 121
See application file for complete search history.

(56) References Cited

U.S. PATENT DOCUMENTS 6,134,482 A * 10/2000 Iwasaki ...................... 700/121
6,275,740 B1 * 8/2001 Smith et al. ................. 700/108
6,937,917 B2    8/2005 Akiyama et al.
7,047,100 B2 * 5/2006 Kitamoto et al. ............ 700/121
7,280,883 B2 * 10/2007 Kitamoto et al. ............ 700/121
7,512,456 B2 * 3/2009 Hamada ..................... 700/114

FOREIGN PATENT DOCUMENTS

JP        2004-193401       * 7/2004

* cited by examiner

*Primary Examiner*—Chun Cao
(74) *Attorney, Agent, or Firm*—Oblon, Spivak, McClelland, Maier & Neustadt, L.L.P.

(57) ABSTRACT

A control device controls a substrate processing apparatus including a processing chamber for processing a substrate and a plurality of units for controlling a condition in the processing chamber. The control device includes a storing device for storing a return time required for each unit to be returned from an energy saving mode to a normal mode; a management device for obtaining a return start timing for each unit to be returned from the energy saving mode to the normal mode, based on the return time of each unit stored in the storing device; and a unit controller for independently controlling each unit to be returned from the energy saving mode to the normal mode, based on the return start timing of each unit obtained by the management device.

15 Claims, 17 Drawing Sheets

| MODULE | UNIT | TIME A | TIME B | Ta WHEN DATA IS UPDATED | Tb WHEN DATA IS UPDATED |
|---|---|---|---|---|---|
| PM | DRY PUMP CONTROL NUMBER OF ROTATION | 1~2 sec | 1~2 sec | — | — |
| LLM | STOP/RESTART ROTATION | 10 sec | 10 sec | — | — |
| | STOP/RESTART DILUTED N₂ PURGE | 1~2 sec | 1~2 sec | — | — |
| | (HYDROGEN EXPLOSION-PROOF DRY PUMP) | 1~2 sec | 1~2 sec | — | — |
| PM | TMP STOP/RESTART DILUTED N₂ PURGE | 1~2 sec | 1~2 sec | — | — |
| PM | PROCESSING CHAMBER U STOP/RESTART N₂ PURGE | 1~2 sec | 1~2 sec | — | — |
| PM | COOLANT SUPPLY SOURCE CONTROL FLOW RATE OF CHILLER | 4~5 sec | 4~5 sec | — | — |
| PM | UPPER/LOWER ELECTRODE AND SIDEWALL CONTROL HEATER TEMPERATURE | 10~20 min | 10~20 min | 40℃ | 60℃ |
| PM | APC CONTROL HEATER TEMPERATURE | 10~20 min | 10~20 min | 40℃ | 90℃ |
| LLM | MOUNTING TABLE CONTROL HEATER TEMPERATURE | 10~20 min | 10~20 min | 40℃ | 55℃ |
| PM | POWER SUPPLY SW | 20~30 min | 20~30 min | — | — |

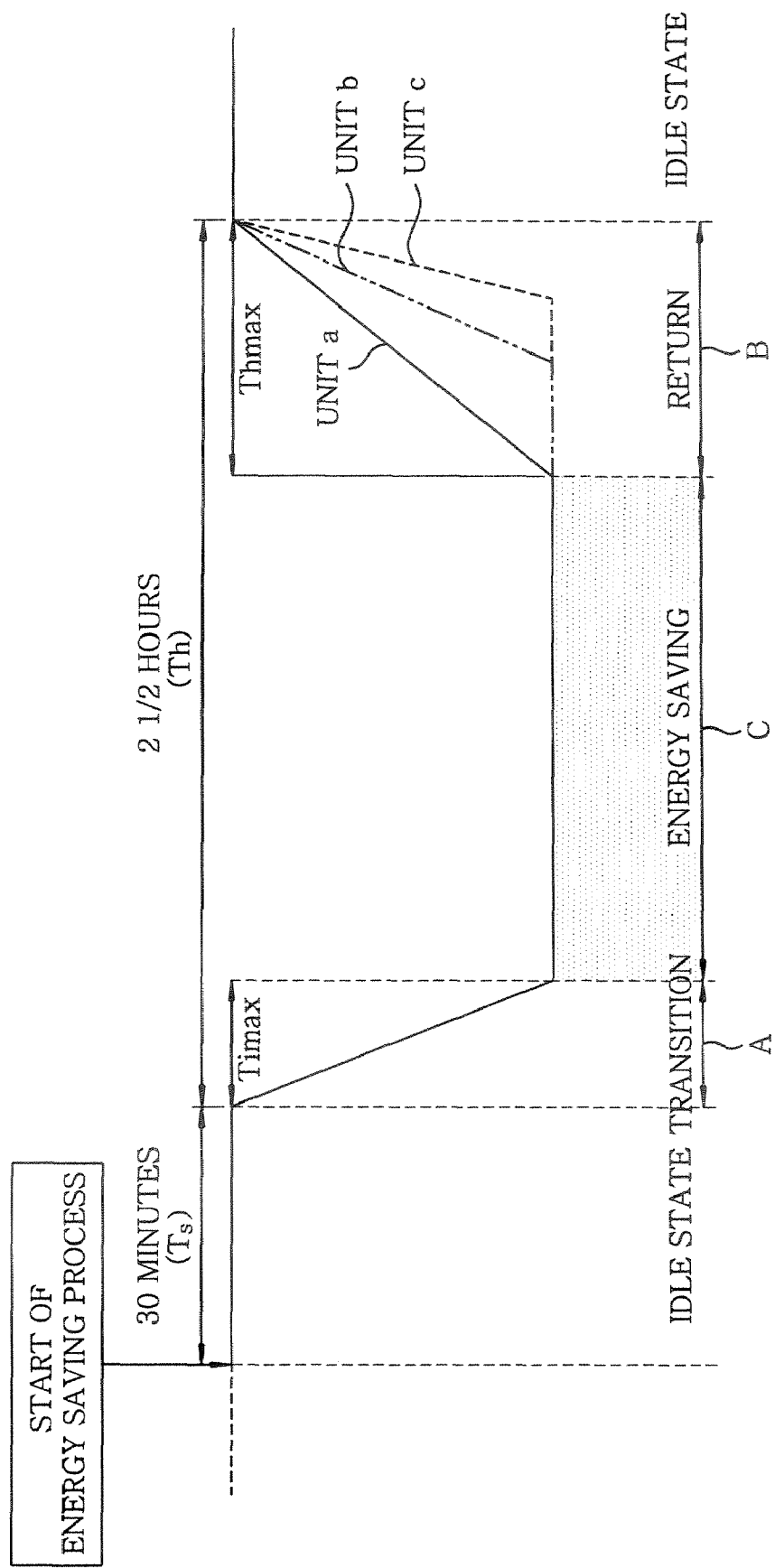

CONTROL DEVICE AND METHOD FOR A SUBSTRATE PROCESSING APPARATUS

FIELD OF THE INVENTION

The present invention relates to a control device and method for controlling a process of a substrate to be processed by reducing energy consumption in a substrate processing apparatus.

BACKGROUND OF THE INVENTION

Concerning an recent issue of global warming, every country has been requested to reduce the emission of carbon dioxide ($CO_2$) which has a high global warming potential according to the Kyoto protocol. In view of the environmental maintenance under the balance of international cooperation and competition, many Japanese enterprises have tried to find solutions to reduce energy consumption and the emission of materials of high global warming potentials in the long term. Specifically, semiconductor factories are continuously in operation for twenty-four hours, and a great quantity of energy, such as gas or electric power, is continuously used during the operation. Therefore, semiconductor manufacturers have made various attempts to effectively use the energy by recycling thermal energy generated in the factories to other energy. As one of the attempts, a vapor absorption chiller is operated in a factory. There is being constructed a system in which a turbo chiller, an LPG absorption chiller and a kerosene absorption chiller are properly operated while using the vapor absorption chiller as basic chilling means, so that exhaust heat is collected to be used as a heat source for air conditioning in the factory. In this manner, the clean room is maintained, and the whole semiconductor factory is operated with high efficiency.

In order to reduce energy consumption not only in the whole factory but also in semiconductor manufacturing equipment in the factory, there are presented apparatuses and methods for controlling the apparatuses for energy saving (see, e.g., Patent Document 1).

In Patent Document 1, a normal mode and an energy saving mode are provided as modes for controlling a plurality of units installed in a substrate processing apparatus. If the energy saving mode is selected, only minimum necessary units are operated to perform a process of a substrate to be processed. Then, if there is a need to increase the efficiency of the process, the substrate is processed by operating additional unit(s). Further, during a standby period, only minimum necessary units are operated while other units are stopped, or the whole units are stopped. Thus, when processing a substrate to be processed, the energy consumed in the substrate processing apparatus can be reduced while maintaining the throughput to a certain extent.

(Patent Document 1) Japanese Patent Publication Application No. 2004-200485

However, the aforementioned technology is presented to save energy in equipments (for example, an atmospheric substrate processing apparatus) in which the condition in a processing chamber thereof is restored instantaneously when the units are restarted. Thus, the aforementioned technology does not involve controlling a substrate processing apparatus (for example, a vacuum substrate processing apparatus) in which a nonnegligible time is required for returning from the energy saving mode to the normal mode. Therefore, in the conventional technology for controlling only the stoppage and restart of each unit, it is impossible to accurately control the condition in the processing chamber while the energy saving mode is being returned to the normal mode.

In reality, in order to process the substrate with a high accuracy, it is very important to control the condition in the processing chamber so as to be stably maintained while the energy saving mode is being returned to the normal mode. Herein, it is necessary to properly manage data accumulated from the past and timings for each of the controls for saving energy and controlling the condition in the processing chamber at proper timings.

SUMMARY OF THE INVENTION

It is, therefore, an object of the present invention to provide a control device and method for a substrate processing apparatus that controls a condition in a processing chamber while reducing energy consumption.

In accordance with one aspect of the present invention, there is provided a control device for controlling a substrate processing apparatus including a processing chamber for processing a substrate and a plurality of units for controlling a condition in the processing chamber, comprising a storing device for storing a return time required for each unit to be returned from an energy saving mode, in which an energy consumption of each unit is restrained, to a normal mode, in which the substrate is capable of being processed; a management device for obtaining a return start timing for each unit to be returned from the energy saving mode to the normal mode, by estimating an amount of time required for each unit to be returned from the energy saving mode to the normal mode based on the return time of each unit stored in the storing device; and a unit controller for independently controlling each unit to be returned from the energy saving mode to the normal mode, based on the return start timing of each unit obtained by the management device.

In a vacuum substrate processing apparatus in which plasma is generated by ionizing or dissociating a gas by using a high frequency power and a substrate is processed by the plasma, a desired process can be performed on the substrate by controlling motion of electrons, ions and radicals in the plasma with a high accuracy. To control the motion of electrons, ions and radicals of the plasma with a high accuracy, it is very important to control the timing when the energy saving mode is returned to the normal mode and the condition in the processing chamber when the return of the mode is completed.

Considering the aforementioned matters, to achieve energy saving and control the condition in the processing chamber at proper timings, data accumulated from the past is stored in a database and an accurate timing control is performed by using various kinds of timers. Thus, the energy that otherwise would be unnecessarily consumed during an idle state in a conventional equipment can be saved, and the condition in a processing chamber after the return of the mode can be accurately controlled.

Thus, even in a vacuum substrate processing apparatus in which a nonnegligible time is required for returning the energy saving mode to the normal mode and a high level of skill is needed for stabilizing the condition in the processing chamber, the energy saving can be achieved and the condition in the processing chamber after the return of the mode can be accurately controlled.

Further, by controlling the condition in the processing chamber by an accurate timing control, the substrate processing system of the present invention can properly control the energy saving mode such that the substrate processing apparatus is not damaged by receiving an impact due to the energy saving mode.

It is preferable that, among a first energy saving mode in which each unit is controlled to restrain an energy consumption thereof within a range that does not influence on a condition in the processing chamber, a second energy saving mode in which each unit is controlled to restrain the energy consumption thereof within a range that influences on the condition inside the processing chamber, and a third energy saving mode in which the whole units are stopped, the unit controller controls each unit to proceed one of the first, second and third energy saving modes selected by an operator or selected automatically.

Further, it is preferable that the unit controller controls each unit to complete the return from the energy saving mode by a preset return end time, instead of controlling each unit by the return start timing obtained by the management device.

Thus, by controlling not only an actual energy saving time bur also a return time required for the return from the energy saving mode to the normal mode, each unit is controlled to be maintained in an energy saving state as long as possible. Thereby, the condition in the processing chamber after the return of the mode can be accurately controlled, and the energy consumption of each unit can be reduced efficiently.

It is preferable that the unit controller automatically selects one of the first, second and third energy saving modes, based on an amount of time required for each unit to be stabilized in the energy saving mode.

Specifically, for example, a storing device may classify each unit into any one of a power-down mode (a first energy saving mode), a pause mode (a second energy saving mode) and an inactive mode (a third energy saving mode), based on a length of time for the unit to be stabilized into the energy saving mode; and pre-register information of the classification. Further, the unit selector section may automatically select a unit that belongs to a designated energy saving mode.

Further, it is preferable that the storing device stores a transition time required for each unit to proceed from the normal mode to the energy saving mode, wherein the management device calculates an energy saving time during which each unit is stabilized in the energy saving mode, based on a time period from a timing at which a transition from the normal mode to the energy saving mode is started to a timing at which a return from the energy saving mode to the normal mode is completed, and the transition time and the return time stored in the storing device, and wherein, if the energy saving time for one or more of the units calculated by the management device is less than or equal to a specific time, or if one or more of the units is determined not to have any energy saving effect by the energy saving time, the unit controller controls said one or more of the units as the normal mode without controlling said one or more of the units as the energy saving mode.

Thus, a unit that can be energy-saved is controlled to proceed to a designated energy saving mode, and a unit that cannot be energy-saved is controlled as the normal mode. In this manner, since only the unit that can be energy-saved is properly controlled as the designated energy saving mode whereas the unit that cannot be energy-saved is controlled as the normal mode, the energy consumption can be more effectively reduced, and the condition in the processing chamber can be protected from being carelessly changed. Further, by protecting the condition in the processing chamber from being carelessly changed, a synergistic effect of shortening the return time of the unit that is being operated in the energy saving mode can also be achieved, so that the energy consumption can be further reduced.

Further, it is preferable that the control device further comprises a setup device for automatically setting up the substrate processing apparatus, before each unit starts to proceed from the normal mode to the energy saving mode and after each unit completes a return from the energy saving mode to the normal mode.

Thus, an inside of the substrate processing apparatus is automatically cleaned and a setup, such as a verification of operations of the substrate processing apparatus and the like, is automatically executed. Thereby, since the condition in the substrate processing apparatus is prevented from being deteriorated, each unit can be proceed to the energy saving mode and returned from the energy saving mode more smoothly.

Further, it is preferable that, if the first energy saving mode is selected, the unit controller performs at least any one of a control of the number of rotation of an exhaust system unit, a supply control of purge gas supplied from a gas supply unit to the exhaust system unit, and a flow rate control of a medium supplied from a cooling unit.

Thus, only such units, that require relatively short times for proceeding to the energy saving mode and being returned from the energy saving mode, are subject to the control for energy saving. As a result, the units can be controlled while suppressing the energy consumption within a range in which the condition in the processing chamber is not influenced.

Further, it is preferable that, if the second energy saving mode is selected, the unit controller performs, in addition to the controls performed if the first energy saving mode is selected, at least any one of a temperature control of a temperature control unit, a supply control of the purge gas supplied form the gas supply unit to the substrate processing apparatus, and a stoppage and restart control of the exhaust system unit.

Thus, the control for energy saving can be further applied to such units that require relatively longer times for proceeding to the energy saving mode and for being returned from the energy saving mode compared to the case of the first energy saving mode. Therefore, although it is within a range in which the condition in the processing chamber is influenced, the units can be controlled to further suppress the energy consumption.

Further, if the third energy saving mode is selected, the unit controller may control connection and disconnection of a power supply unit of the substrate processing apparatus In conventional substrate processing apparatus, a certain amount of energy is used to maintain the idle state even when the substrate processing apparatus is not operated for a long time. However, in accordance with the above configuration, when the substrate processing apparatus is not operated for a long time, the energy can be preserved without being consumed by disconnecting the power supply of the substrate processing apparatus.

The control device may control a plurality of substrate processing apparatuses, and the unit controller may respectively control each of the substrate processing apparatuses, such that a plurality of units provided in each of the substrate processing apparatuses are to proceed to one of the first, second and third energy saving modes selected by the operator or automatically per each of the substrate processing apparatuses.

Further, it is preferable that the substrate processing apparatus includes a plurality of units for controlling a condition of an airtight chamber connected to the processing chamber, and wherein the unit controller controls the units disposed in the processing chamber and the units disposed in the airtight chamber.

Thus, the units provided in an airtight chamber (for example, a load-lock chamber) connected to the processing chamber, together with the units provided in the processing chamber of the substrate processing apparatus, are controlled. Thereby, unnecessary energy consumption in the airtight chamber can be reduced.

In accordance with another aspect of the present invention, there is provided a method of controlling a control device for a substrate processing apparatus including a processing chamber for processing a substrate and a plurality of units for controlling a condition in the processing chamber, comprising the steps of: storing a return time in a storing device, the return time being a time required for each unit to be returned from an energy saving mode, in which an energy consumption of each unit is restrained, to a normal mode, in which the substrate is capable of being processed; obtaining a return start timing for each unit to be returned from the energy saving mode to the normal mode, by estimating an amount of time required for each unit to be returned from the energy saving mode to the normal mode based on the return time of each unit stored in the storing device; and controlling independently each unit to be returned from the energy saving mode to the normal mode, based on the obtained return start time of each unit.

Thus, to achieve energy saving and control the condition in the processing chamber at proper timings, data accumulated from the past is stored in a database, and an accurate time control is performed by using various kinds of timers. Thereby, the energy that would be unnecessarily consumed during the idle state in the conventional case can be saved, and the condition in the processing chamber after the return from the energy saving mode can be accurately controlled.

It is preferable that the unit controller controls each unit to complete the return from the energy saving mode by a preset return end time, instead of controlling each unit by the obtained return start timing.

Further, it is preferable that a transition time is stored in the storing device, the transition time being a time required for each unit to proceed from the normal mode to the energy saving mode, wherein an energy saving time during which each unit is stabilized in the energy saving mode is calculated, based on a time period from a timing at which a transition from the normal mode to the energy saving mode is started to a timing at which a return from the energy saving mode to the normal mode is completed, and the transition time and the return time stored in the storing device, and wherein, if the calculated energy saving time for one or more of the units is less than or equal to a specific time, or if one or more of the units is determined not to have any energy saving effect by the energy saving time, the unit controller controls said one or more of the units as the normal mode without controlling said one or more of the units as the energy saving mode.

As described above, in accordance with the control device and method for a substrate processing apparatus of the present invention, the energy consumption is reduced while the condition in the processing chamber is controlled.

BRIEF DESCRIPTION OF THE DRAWINGS

The above and other objects and features of the present invention will become apparent from the following description of embodiments, given in conjunction with the accompanying drawings, in which:

FIG. 9 is a view illustrating data stored in a database;

FIG. 15 is a view for explaining an exemplary energy saving state in accordance with the second and third embodiments.

DETAILED DESCRIPTION OF THE EMBODIMENTS

Figure 1:
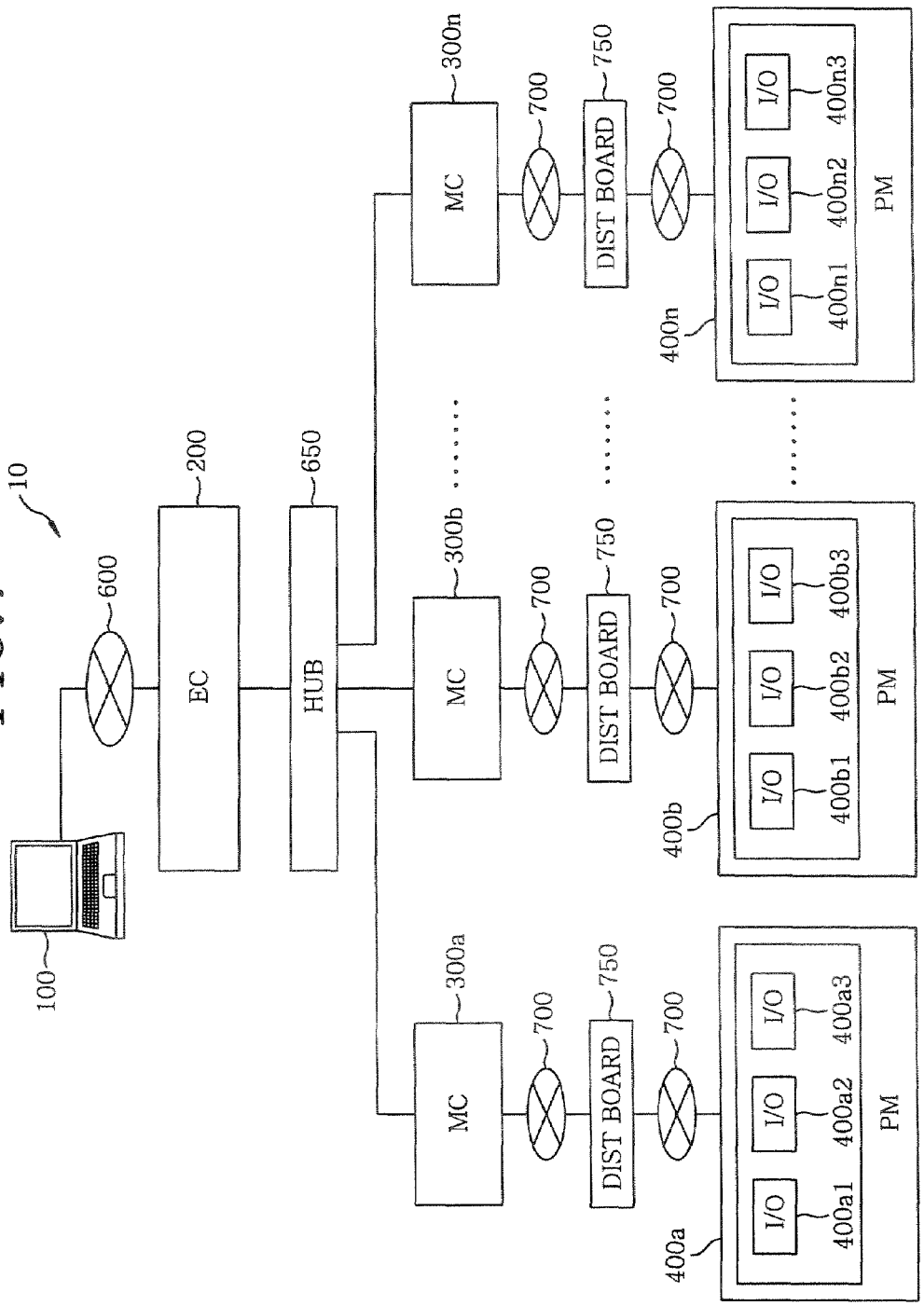
FIG. 1 is a view of a substrate processing system in accordance with each embodiment of the present invention.

Hereinafter, the present invention will be described with reference to the accompanying drawings. In describing the embodiments and drawings of the present invention, the elements that have the substantially same configuration and function are indicated by same reference numerals and are not described herein to avoid redundancy.

First Embodiment

A substrate processing system using an equipment controller according to a first embodiment of the present invention will be described with reference to FIG. 1. In the first embodiment, a film forming process and an etching process will be described as examples of processes performed by the substrate processing system.

(Substrate Processing System)

The whole constitution of the substrate processing system will be described with reference to FIG. 1. A substrate processing system 10 Secludes a manufacturing execution system (MES) 100, an equipment controller (EC) 200, a switching hub 650, n number of module controllers (MC) 300a to 300n, distribution (DIST) boards 750, and process modules (PM) 400a to 400n.

The MES 100, which includes a data processor such as a personal computer (PC) and the like, controls a manufacturing process of a whole factory including a plurality of PMs 400 and transmits and receives information to and from a basic operation system (not shown). The MES 100 is connected to the EC 200 via a network 600 such as a local area network (LAN) and the like.

The EC 200 controls a plurality of MCs 300 connected to the switching hub 650, thereby controlling the processes performed in a plurality of PMs 400 in an integrated manner. Specifically, the EC 200 transmits a control signal to each MC 300 at a specific timing, based on a recipe indicating a method of processing a wafer W to be processed. The switching hub 650 converts a source of the control signal transmitted from the EC 200 to any one of the MCs 300a to 300n. Each MC 300 performs a control such that a desired process is performed on the wafer W in the PM, based on the transmitted control signal. Herein, the EC 200 functions as a master tool and the MC 300 functions as a slave tool. Further, during an idle state when no process is performed, the EC 200 controls the PM 400 from a normal mode to an energy saving mode, which will be described later.

The MCs 300 are respectively connected to a plurality of I/O ports 400a1 to 400a3, 400b1 to 400b3, . . . , and 400n1 to 400n3 included in each PM 400, via a general high-speed optimum scalable transceiver (GHOST) network 700 by the DIST boards 750. The GHOST network 700 is controlled by a large scale integration (LSI) (that is also referred to as "GHOST") positioned on a MC board of the MC 300. Here, the MC 300 functions as a master tool and the I/O ports function as slave tools. The MC 300 transmits an actuator driving signal, which corresponds to the control signal transmitted from the EC 200, to any one of the I/O ports.

The I/O port transfers the actuator driving signal, transmitted from the MC 300, to a corresponding unit positioned in each PM 400, thereby allowing each unit to be driven based on a command from the EC 200 and transferring a signal, which is output from the corresponding unit, to the MC 300.

Hereinafter, the hardware constitution of the EC 200 and PM 400 will be described with reference to FIGS. 2 and 3. The hardware constitutions of the MES 100 and MC 300, although not illustrated, are same as that of the EC 200.

(Hardware Constitution of EC)

Figure 2:
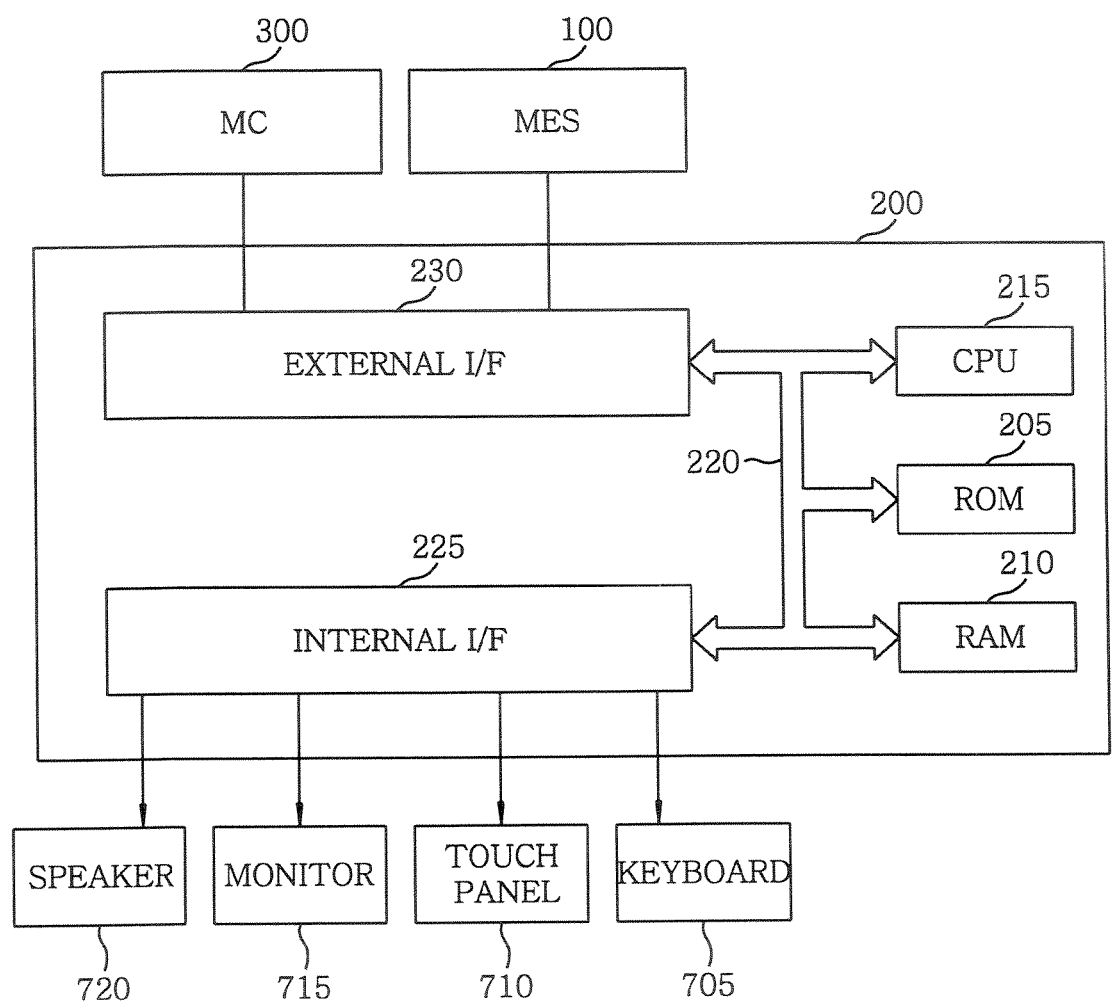
FIG. 2 is a hardware block diagram of an equipment controller (EC) in accordance with each embodiment of the present invention.

As illustrated in FIG. 2, the EC 200 includes ROM 205, RAM 210, CPU 215, bus 220, internal interface (internal I/F) 225, and external interface (external I/F) 230.

The ROM 205 stores a basic program to be performed in the EC 200 or a program to start upon something wrong. The RAM 210 stores various kinds of programs and/or data. The ROM 205 and the RAM 210 are examples of memory devices. Alternatively, an EEPROM, an optical disk, a magneto-optical disk, a hard disk and the like may be used as the memory device.

The CPU 215 controls the PM 400 in the normal mode or the energy saving mode, and manages a film forming process or an etching process. The bus 220 is a path for delivering the information between devices.

The internal interface 225 inputs necessary parameters (data) from a keyboard 705 or a touch panel 710 by a manipulation of an operator, and outputs necessary information to a monitor 715 or a speaker 720. The external interface 230 transmits and receives data to and from the MES 100 or the MC 300.

(Hardware Constitution of PM)

Figure 3:
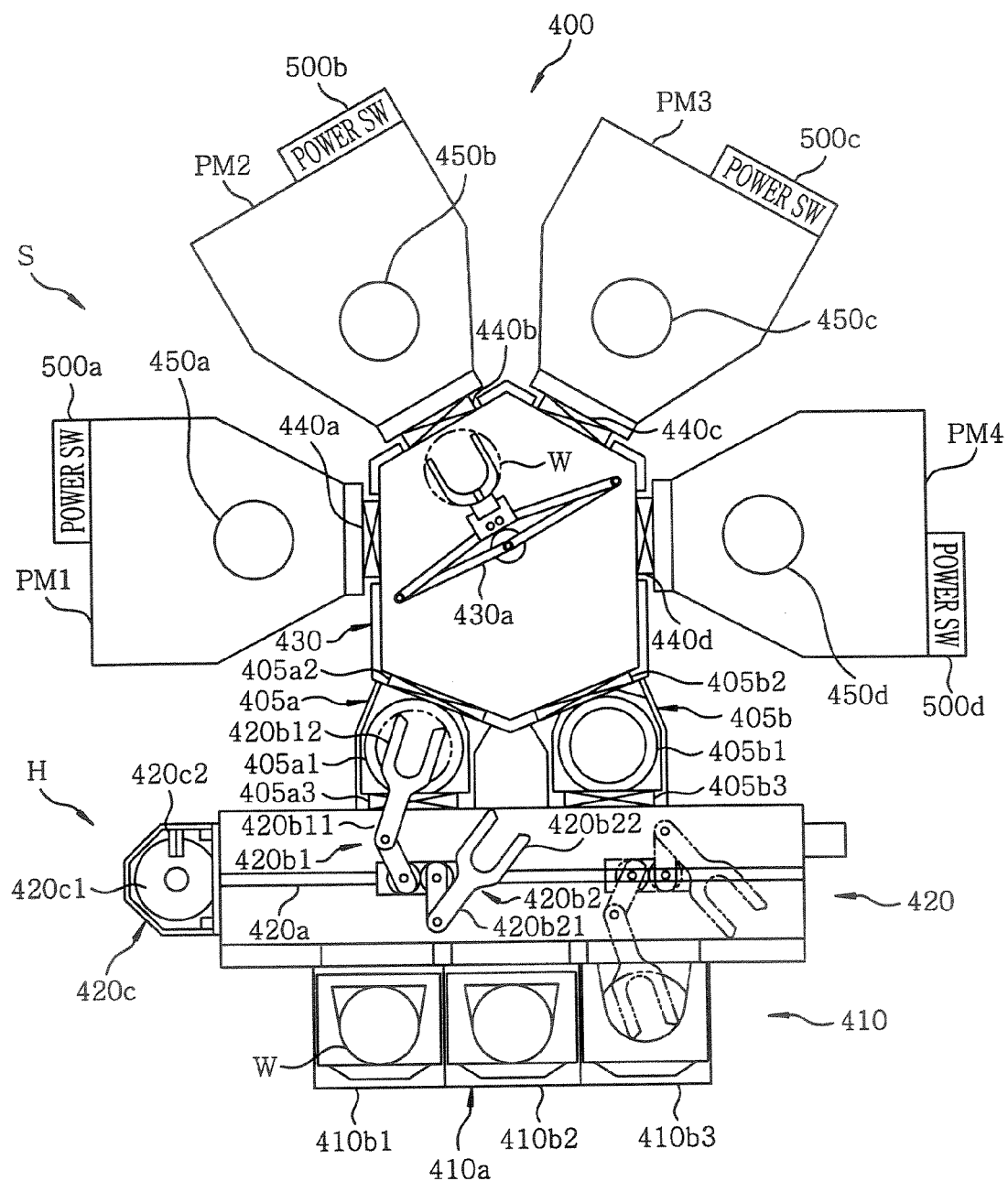
FIG. 3 is a hardware block diagram of a process module (PM) in accordance with each embodiment of the present invention.

As illustrated in FIG. 3, the PM 400 (corresponding to a substrate processing apparatus) includes a transferring system H for carrying a wafer W into and out of a processing chamber; and a processing system S for performing a film forming process or an etching process on the wafer W. The transferring system H and the processing system S are connected to each other via a load-lock module 405 (LLM: 405a and 405b).

The transferring system H includes a cassette stage 410 and a transfer stage 420. In the cassette stage 410, a container mounting table 410a is disposed to receive three cassette containers 410b1, 410b2 and 410b3. Each cassette container 410b receives, for example, twenty-five wafers W at the most.

At a center of the transfer stage 420, a guide rail 420a is placed to be extended along a transferring direction. In the guide rail 420a, two transfer arms 420b1 and 420b2 for transferring the wafers W are supported to be slidably moved by magnetic driving along the guide rail 420a. The transfer arms 420b1 and 420b2 respectively include transfer arm bodies 420b11 and 420b21 having a plurality of joints to be bent, stretched and rotated; and forks 420b12 and 420b22 respectively attached to the front ends of the transfer arm bodies 420b1, wherein the wafers W are held on the forks 420b12 and 420b22.

At one end of the transfer stage 420, a position adjustor 420c is positioned for determining the position of the wafer W. The positioning adjustor 420c rotates a rotation table 420c1 while holding the wafer W, and an optical sensor 420c2 detects a state of an outer edge of the wafer W, so that the position of the wafer W is adjusted.

The LLM 405a and 405b respectively include mounting tables 405a1 and 405b1, and gate valves 405a2, 405a3, 405b2 and 405b3. The wafers W are loaded on the mounting tables 405a1 and 405b1. The gate valves 405a2, 405a3, 405b2 and 405b3 are respectively positioned at both ends of each LLM 405a and 405b, and are airtightly open and closed. By the above-described constitution, the transferring system H transfers the wafers W between the cassette containers 410b1, 410b2 and 410b3, the LLMs 405a and 405b and the position adjustor 420c.

The processing system S includes a transfer chamber 430 and four process modules PM1, PM2, PM3 and PM4. The transfer chamber 430 is connected to each of PM1, PM2, PM3 and PM4 through gate valves 440a, 440b, 440c and 440d which are airtightly opened and closed. The transfer chamber 430 includes an arm 430a capable of being bent, stretched and rotated.

PM1, PM2, PM3 and PM4 include mounting tables 450a, 450b, 450c and 450c on which wafers are loaded. By the processing system S in the above-described constitution, the wafer W is carried from the LLM 405 to each of PM1, PM2, PM3 and PM4 via the transfer chamber 430 by using the arm 430a. After the film forming process is performed on the wafer W loaded on each mounting table 450, the wafer W is carried out to the LLM 405 via the transfer chamber 430. Each of PM1, PM2, PM3 and PM4 includes a switch to turn on and off the power for each of PM1, PM2, PM3 and PM4.

Figure 4:
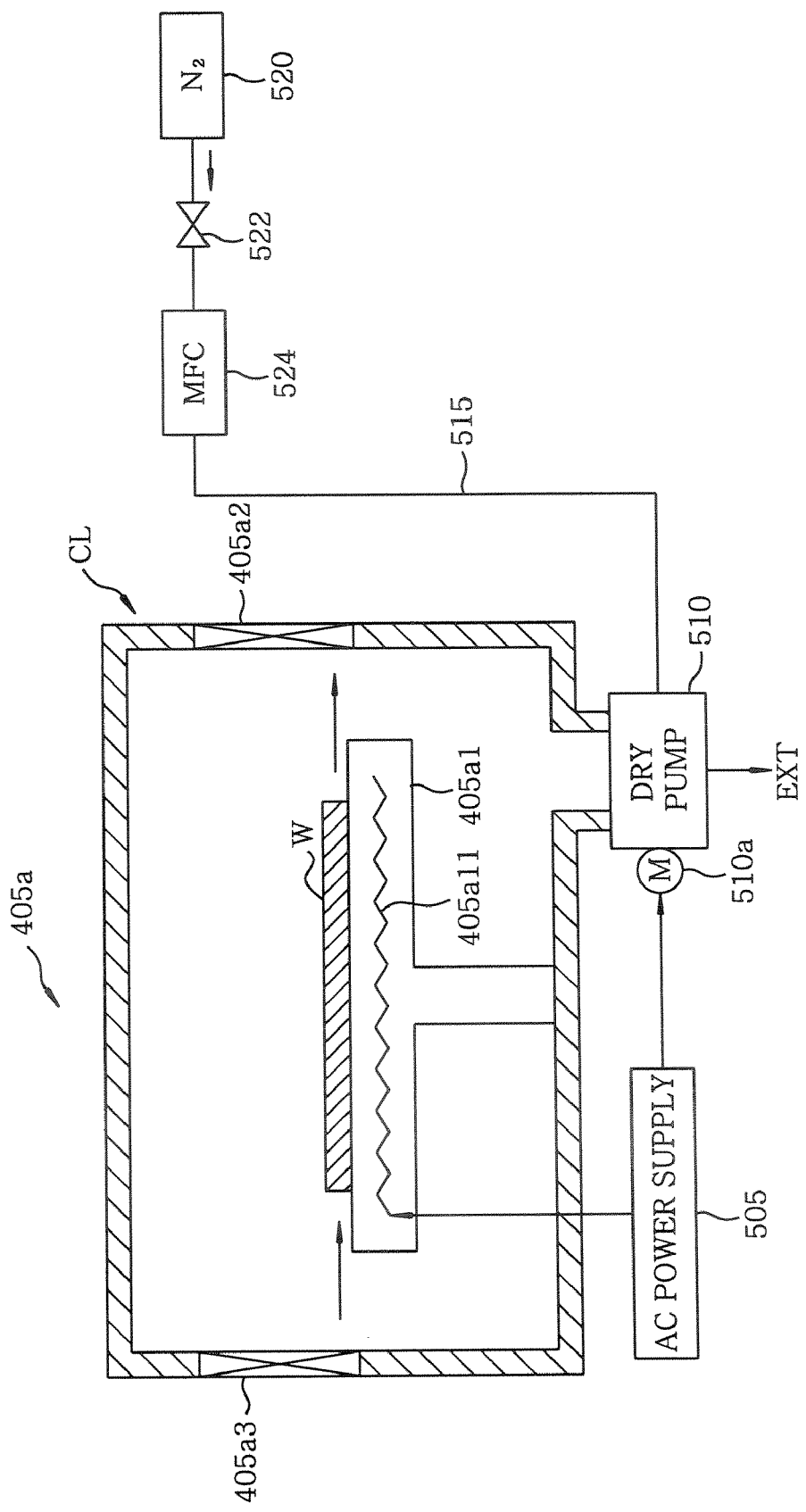
FIG. 4 is a vertical sectional view of a load-lock module (LLM) in accordance with each embodiment of the present invention.

Hereinafter, the internal constitution and function of the LLM 405 will be described with reference to a vertical sectional view thereof as shown in FIG. 4.

(Internal Constitution and Function of LLM)

In FIG. 4, the LLM 405a includes a chamber CL in a nearly cylindrical shape, which is constituted to be airtight so that the transfer chamber 430 and PM1, PM2, PM3 and PM4 are not open to the air. The chamber CL includes the mounting table 405a1; and the gate valves 405a2 and 405a3 which are opened and closed to carry the wafer W in and out. A heater 405a11, embedded inside the stage 405a1, is connected to an AC power source 505 positioned outside the chamber CL. The heater 405a11 maintains the wafer W at a specific temperature by an AC voltage supplied from the AC power source 505.

A dry pump 510, positioned at the bottom of the LLM 405a, is connected to the AC power supply 505 as well as a $N_2$ gas supply 520 via a gas line 515. A rotation speed (the number of rotation) and/or the stoppage and restart of the dry pump 510 is controlled by driving a motor 510a by properly changing a frequency of the AC power supply 505 by using an inverter (not shown). The $N_2$ gas supply 520 properly supplies purge gas to the dry pump 510 by controlling the opening and closing of a valve 222 and a flow rate of a mass flow controller 524. Thereby, the dry pump 510 depressurizes the LLM 405a to a desired level, considering the issue of corrosion.

(Internal Constitution and Function of PM: Film Forming Process)

Hereinafter, the internal constitution and function of the PM in case of performing the film forming process will be described with a vertical sectional view of the PM illustrated in FIG. 5.

The PM includes a chamber CP in a nearly cylindrical shape which is constituted to be airtight. As described above, the mounting table 450 on which the wafer W is loaded is positioned in the chamber CP. A processing chamber U for processing the wafer W is formed in the chamber CP. The mounting table 450 is supported by a supporting member 451 in a cylindrical shape. A guide ring 452 for guiding the wafer W and focusing plasma is positioned at the outer edge of the mounting table 450. A stage heater 454 is embedded inside the mounting table 450.

The chamber CP includes an automatic pressure controller (APC) 530, a turbo molecular pump (TMP) 535 and a dry pump 540 as exhaust units. The inside of the chamber CP is depressurized to a specific level by these exhaust units.

An APC heater 530a is embedded inside the APC 530. The stage heater 454, the APC heater 530a, the TMP 535, and the dry pump 540 are connected to an AC power supply 525 outside the chamber CP. The heaters 454 and 530a respectively maintain the wafer W and the inside of the APC 540 at specific temperatures, by the AC voltage supplied from the AC power supply 525. Rotation speeds (the numbers of rotation) or the stoppages and restarts of the TMP 535 and the dry pump 540 is controlled by driving motors 535a and 540a while properly changing the frequency of the AC power supply 525 by an inverter (not shown).

A shower head 460 is positioned at a ceiling wall 458a of the chamber CP through an insulating member 459. The shower head 460 is formed of an upper block frame 460a, a middle block frame 460b and a lower block frame 460c. A dual system gas path (one gas path 460a1 and the other gas path 460a2) is formed in each block frame 460. The dual system gas path communicates with injection holes 460c1 and injection holes 460c2 which are alternately formed in the lower block frame 460c.

A gas supply unit 470 includes gas supplies 470a, 470b, 470c, 470d and 470e, a plurality of valves 472, and a plurality of mass flow controllers 474. Each valve 472 is controlled to be opened and closed, thereby selectively supplying gas from each gas supply into the chamber CP. Further, each mass flow controller 474 controls a flow rate of gas, thereby adjusting the gas to have desired concentration.

Among the gas supplies, a $N_2$ gas supply 470a, a $TiCl_4$ gas supply 470b and an Ar gas supply 470c are connected to the shower head 460 via a gas line 465a, and a $H_2$ gas supply 470d and a $N_2$ gas supply 470e are connected to the shower head 460 via a gas line 465b. Further, the $N_2$ gas supply 470e is connected to the TMP 535 and the dry pump 540 via a gas line 465c. The $N_2$ gas supplies 470a and 470e supply purge gas to the chamber CP and/or each pump. The $TiCl_4$ gas supply 470b, the Ar gas supply 470c, and the $H_2$ gas supply 470d supply $TiCl_4$ gas as a process gas for forming a Ti layer, Ar gas for exciting plasma, and $H_2$ gas as a reducing gas into the chamber CP, respectively. Further, the $N_2$ gas supply 470e properly supplies purge gas to the TMP 535 and the dry pump 540, by controlling the opening and closing of valves 476 and 478. Thereby, the TMP 535 and the dry pump 540 depressurize the inside of the chamber CP to a desired level, considering the issue of corrosion.

The shower head 460 is connected to a high frequency power supply 545 via an matching unit 490. Further, an electrode 494 opposite to an electrode of the shower head 460 is embedded in the mounting table 450. The electrode 494 is connected to a RF electrode 550 via a matching unit 496. A high frequency power is supplied from the high frequency power supply 550 to the electrode 494, thereby generating a bias voltage.

Thus, by supplying the high frequency power from the high frequency power supply 545 to the shower head 460, the gas supplied from the gas supply units 470 to the chamber CP through the shower head 460 is plasmatized, so that the Ti layer is formed on the wafer W by the plasma.

(Internal Constitution and Function of PM: Etching Process)

Hereinafter, the internal constitution and function of the PM, in case of performing a chemical oxide removal (COR) process and a post heat treatment (PHT) process on the wafer W being etched, will be described with reference a vertical sectional view of the PM illustrated in FIGS. 6 and 7. After the etching process of the wafer W, the COR process makes a chemical reaction of a natural oxide layer ($SiO_2$ layer) attached to the inside of an etched portion and gas molecules of the process gas, thereby producing a reaction product. The PHT process heats the wafer W after the COR process.

Figure 6:
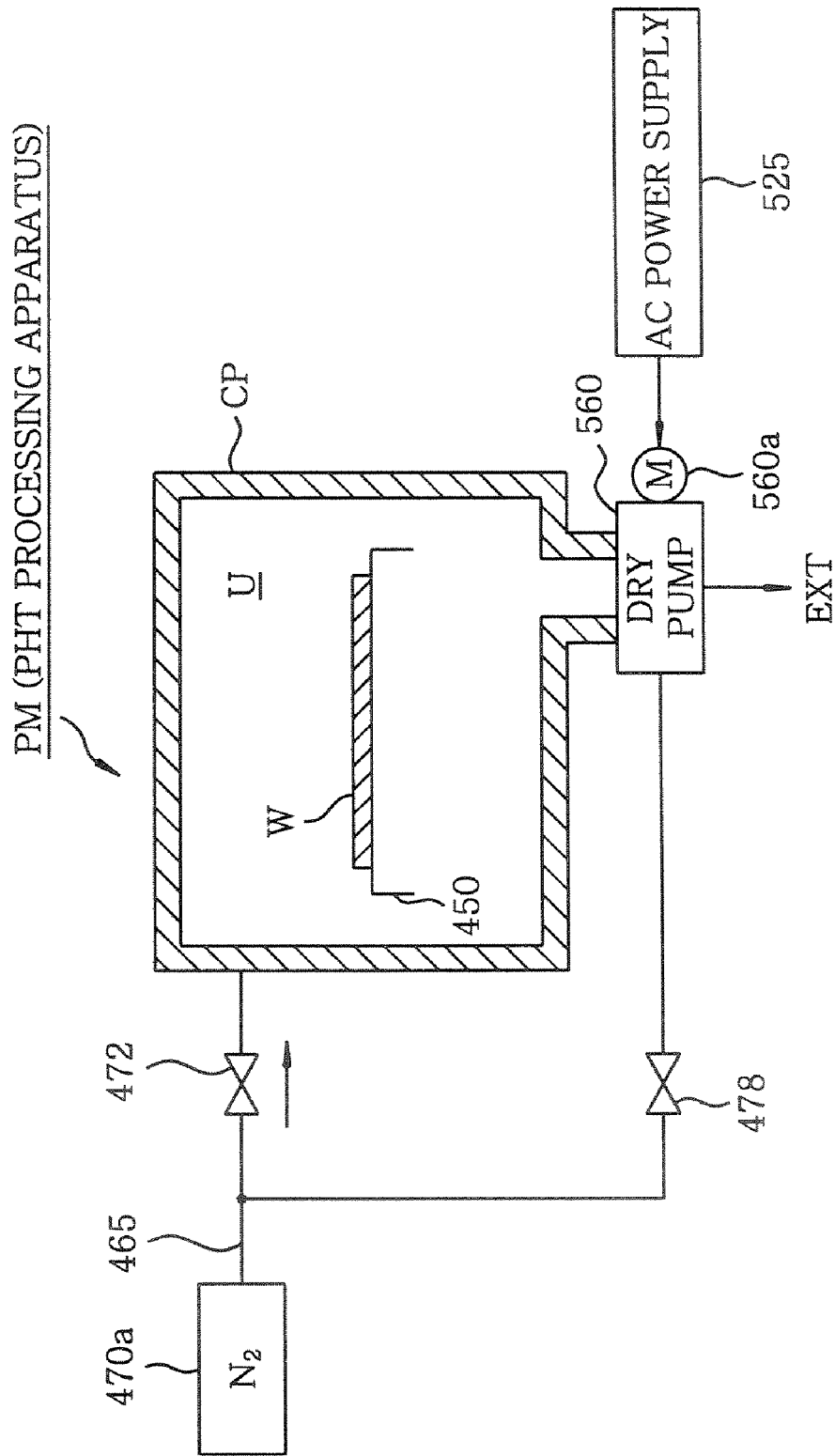
FIG. 6 is a vertical sectional view of a PM (post heat treatment (PHT) processing apparatus) in accordance with each embodiment of the present invention.
Figure 7:
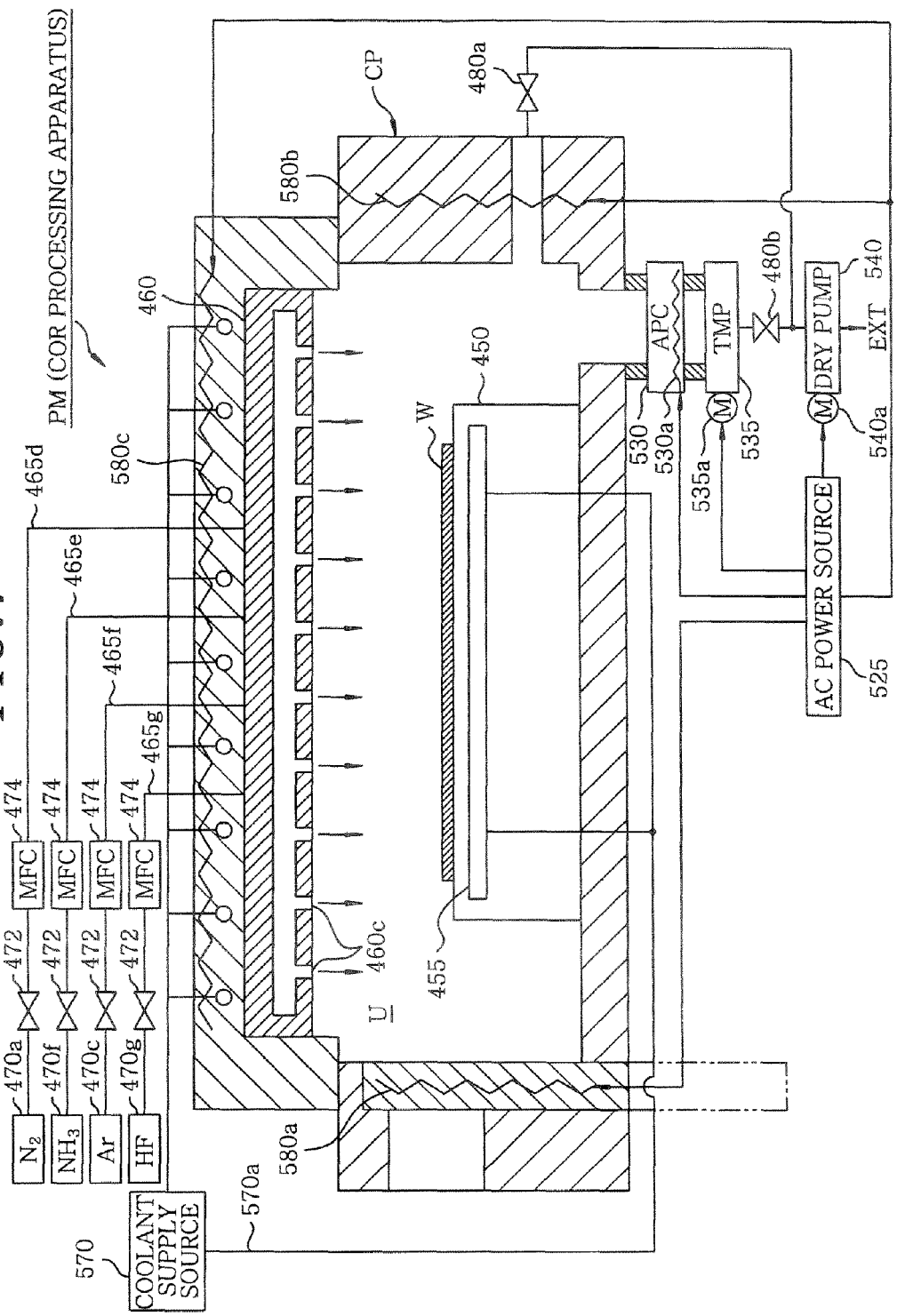
FIG. 7 is a vertical sectional view of a PM (chemical oxide removal (COR) processing apparatus) in accordance with each embodiment of the present invention.

FIG. 6 is a vertical sectional view of the PM (PHT process apparatus) for performing the PHT process on the wafer W; and FIG. 7 is a vertical sectional view of the PM (COR process apparatus) for performing the COR process on the wafer, wherein the PM (COR process apparatus) is positioned adjacently to the PM (PHT process apparatus).

The PHT process apparatus includes an airtight chamber CP. The chamber CP includes a processing chamber U for processing a wafer W loaded on a mounting table 450. An exhaust pump 560 (for example, a dry pump) is positioned in the chamber CP. A rotation speed (the number of rotation) or the stoppage and restart of the exhaust pump 560 is controlled by driving a motor 560a by properly changing the frequency of an AC power supply 525. Further, the PHT process apparatus is connected to a $N_2$ gas supply 470a via a gas line 465. Opening and closing of valves 472 and 478 are controlled, thereby properly supplying purge gas to the chamber CP and the exhaust pump 560, respectively. Thereby, the exhaust pump 560 depressurizes the inside of the chamber CP to a desired level, considering the issue of corrosion.

Likewise, the COR process apparatus of FIG. 7 includes an airtight chamber CP. The chamber CP includes a processing chamber U for processing a wafer W loaded on a mounting table 450. The chamber CP includes exhaust units (APC 530, TMP 535, and dry pump 540). A rotation speed (the number of rotation) or the stoppage and restart of each unit is respectively controlled by driving motors 535a and 540a at specific frequencies by using a AC voltage of an AC power supply 525. Thereby, the exhaust pump 560 depressurizes the inside of the chamber CP to a desired level.

A shower head 450 is connected to a $N_2$ gas supply 470a, a NH3 gas supply 470f, an Ar gas supply 470c, and a HF gas supply 470g via gas lines 465d, 465e, 465f and 465g. Accordingly, gases are selectively supplied, at a desired flow rate controlled by the valve 472 and the MFC 474, to the chamber CP through a plurality of injection holes 460c formed in the shower head 460. The purge gas supplied from the $N_2$ gas supply 470a is properly supplied to the TMP 535 and the dry pump 540, respectively, via a gas line (not shown).

A temperature controller 455 is positioned in the mounting table 450. A coolant supply source 570 is connected to the temperature controller 455 via a conduit path 570a. The temperature of the mounting table 450 is controlled by heat exchange with a temperature controlling liquid (for example, water) which is supplied from the coolant supply source 570 and circulates through the conduit path 570a. As a result, the temperature of the wafer W is maintained at a desired temperature.

Heaters 580a, 580b and 580c are respectively positioned in the sidewalls of the chamber CP and the shower head (upper electrode) 460. The AC power supply 525 is connected to the heaters 580a, 580b and 580c and the heater 530a in the APC 530, so that the shower head 460, the sidewalls of the chamber CP and the APC 530 are respectively maintained at desired temperatures, by the AC voltage supplied from the AC power supply 525.

(Functional Constitution of EC)

Figure 8:
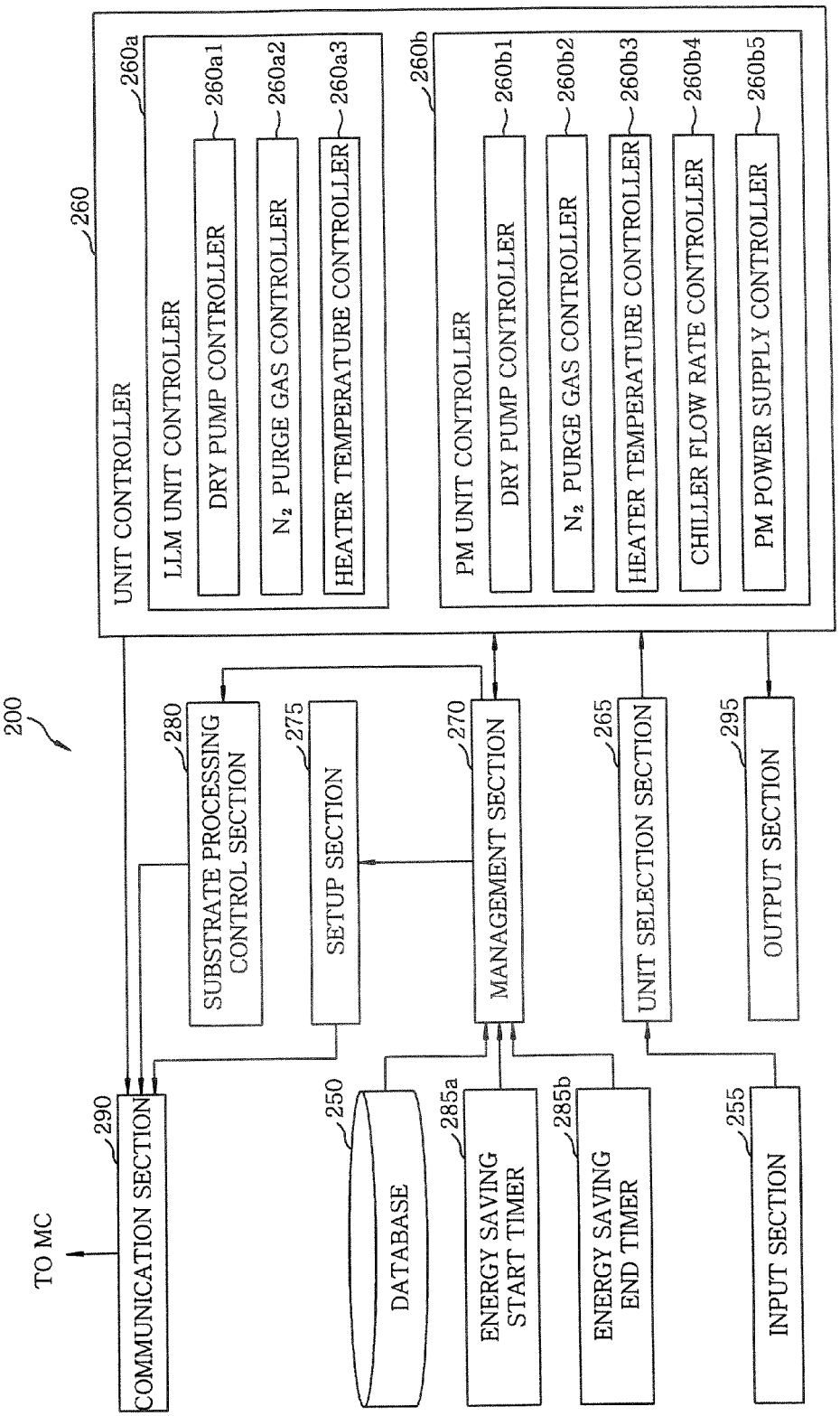
FIG. 8 is a functional block diagram of the EC in accordance with each embodiment of the present invention.

Hereinafter, the functions of the EC 200 will be described with reference to a block diagram of each function illustrated in FIG. 8. The EC 200 has the functions indicated in blocks as shown, such as, a database 250, an input section 255, a unit controller 260, a unit selection section 265, a management section 270, a setup section 275, a substrate processing control section 280, an energy saving start timer 285a, an energy saving end timer 285b, a communication section 290, and an output section 295.

As illustrated in FIG. 9, the database 250 (corresponding to a storing device) stores an energy saving transition time A for each unit, and an energy saving return time B. The energy saving transition time A and the energy saving return time B are calculated by using data accumulated from the past. Specifically, each of the energy saving transition time A and the energy saving return time B may be an actual time for a lot previously processed or an average of actual times for the lots previously processed. Further, considering that the energy saving transition time A and the energy saving return time B vary depending on units and/or process conditions, a present energy saving transition time A and a present energy saving return time B may be calculated by using the energy saving transition time A and the energy saving return time B stored in the database 250.

The energy saving transition time A is a time required for each unit to proceed from the normal mode, in which each unit is enabled to process the wafer W, to the energy saving mode in which energy consumption is restrained. The energy saving return time B is a time required for each unit to be returned from the energy saving mode to the normal mode.

A temperature control unit of the database 250 stores an energy saving temperature Ta and a return temperature Tb. The energy saving temperature Ta is a temperature set when updating the energy saving transition time A and the energy saving return time B. The temperature Tb is a temperature set for a recipe to be used after the return from the energy saving mode. For example, the temperature Ta of the heaters positioned at the upper electrode, lower electrode and sidewalls of the PM 400 is set to be 40° C., and the temperature Tb thereof is set to be 60° C.

When an operator selects a unit to be set as the save energy mode and/or a level of the energy saving mode on a parameter selection screen, the input section 255 inputs data on the selected unit and/or the selected level. The level of the energy saving mode includes, for example, a power-down mode (a first energy saving mode), a pause mode (a second energy saving mode), and an inactive mode (a third energy saving mode). In the energy saving mode, each different mode is individually selected for each PM.

The power-down mode is a mode in which each unit is controlled by restraining energy consumption within a range which does not influence on the condition inside the processing chamber U. A unit suitable for the power-down mode is a unit for which a time from an end of the present lot to a start of the next lot is short, and a time for the return from the energy saving mode is short. Specifically, among the units illustrated in FIG. 9, units which have the energy saving transition time A and the energy saving return time B of 4 to 5 seconds are suitable for the power-down mode.

The pause mode controls each unit by restraining energy consumption within a range which influences on the condition inside the processing chamber U. A unit suitable for the pause mode is a unit in which, for example, the time from the end of the present lot to the start of the next lot is shorter than the power-down mode, and the time for the return from the energy saving mode is longer than the power-down mode. Specifically, examples of the suitable unit for the pause mode include a heater temperature controller, a $N_2$ purge gas controller for controlling the $N_2$ purge gas supply to the processing chamber U in the PM or LLM, and a dry pump controller for controlling the stoppage and restart of a dry pump, each of which has the energy saving transition time A and the energy saving return time B of 10 to 20 minutes.

After the heater temperature controller controls the heater temperature to be a set temperature, it takes some time until the inside of the processing chamber U is stabilized in the set temperature. In this regard, since the heater temperature controller is supposed to influence on the condition inside the processing chamber U, it is suitable for the pause mode. Similarly, after the $N_2$ purge gas controller is supplied to the processing chamber U, it takes some time until the pressure inside the processing chamber U is adjusted to be at desired pressure. In this regard, since the $N_2$ purge gas controller is supposed to influence on the condition inside the processing chamber U, it is also suitable for the pause mode. Likewise, when the dry pump dry pump controller stops the dry pump and then restarts it, it takes some time until the pressure inside the processing chamber U is adjusted to be at desired pressure. In this regard, since the dry pump controller is supposed to influence on the condition inside the processing chamber U, it is suitable for the pause mode.

The inactive mode is a mode in which each unit is controlled in case it takes a long time for the next lot to be started, for example, when the operation of the system is temporarily stopped or a maintenance process such as cleaning of the PM or the like is performed. A unit suitable for the inactive mode is a mode in which, for example, the time from the end of the present lot to the start of the next lot is several minutes to several hours and longer than the pause mode. Specifically, an example of the suitable unit for the pause mode includes a PM power supply unit for controlling connection and disconnection of the power supply of the PM.

The unit controller 260 includes a LLM unit controller 260a and a PM unit controller 260b. The LLM unit controller 260a includes a dry pump controller 260a1, a N₂ purge gas controller 260a2, and a heater temperature controller 260a3. The PM unit controller 260b includes a dry pump controller 260b1, a N₂ purge gas controller 260b2, a heater temperature controller 260b3, a chiller flow rate controller 260b4, and a PM power supply controller 260b5.

Here, a 'unit' means a part which separately and independently operates according to the actuator driving signal transmitted from the MC 300 via each I/O port of FIG. 1 in response to a control signal transmitted by each unit control 260. That is, the unit controller 260 separately and independently controls each target unit at specific timings.

As illustrated in FIG. 9, the dry pumps of the PM and the LLM and the TMP are exhaust units. Further, the N₂ gas supply is a gas supply unit. The coolant supply source 570 is a cooling unit. The heaters 580a, 580b and 580c installed at the sidewalls of the chamber PC and the shower head (upper electrode) 460, the heater 530a of the APC, the heater 454 of the mounting table are temperature adjusting units. A power supply SW 500 provided in each PM is a power unit.

For example, when the actuator driving signal, in response to a control signal transmitted from the dry pump controller 260a1, is transmitted to the AC power supply 505 of FIG. 4 through the I/O port, a desired AC voltage is supplied from the AC power supply 505 according to the actuator driving signal, thereby controlling the number of rotation of a rotor (not shown) of the motor 510a. Thereby, the dry pump controller 260a1 controls the number of rotation and the stoppage and restart of the dry pump 510.

Further, when the actuator driving signal, in response to a control signal transmitted from the N₂ purge gas controller 260a2, is transmitted to the valve 522 through the I/O port, the valve 522 is opened according to the actuator driving signal, so that the N₂ purge gas is supplied from the N₂ gas supply 520 to the dry pump 510. Thereby, the N₂ purge gas controller 260a2 controls the N₂ purge gas supplied to the dry pump 510.

Further, when the actuator driving signal, in response to a control signal transmitted from the heater temperature controller 260a3, is transmitted to the AC power supply 505 through the I/O port, a desired AC voltage is supplied from the AC power supply 505 according to the actuator driving signal, thereby controlling the temperature of the heater 405a11 embedded in the mounting table 405a1. Thereby, the heater temperature controller 260a3 controls the temperature of the heater 405a11.

Figure 5:
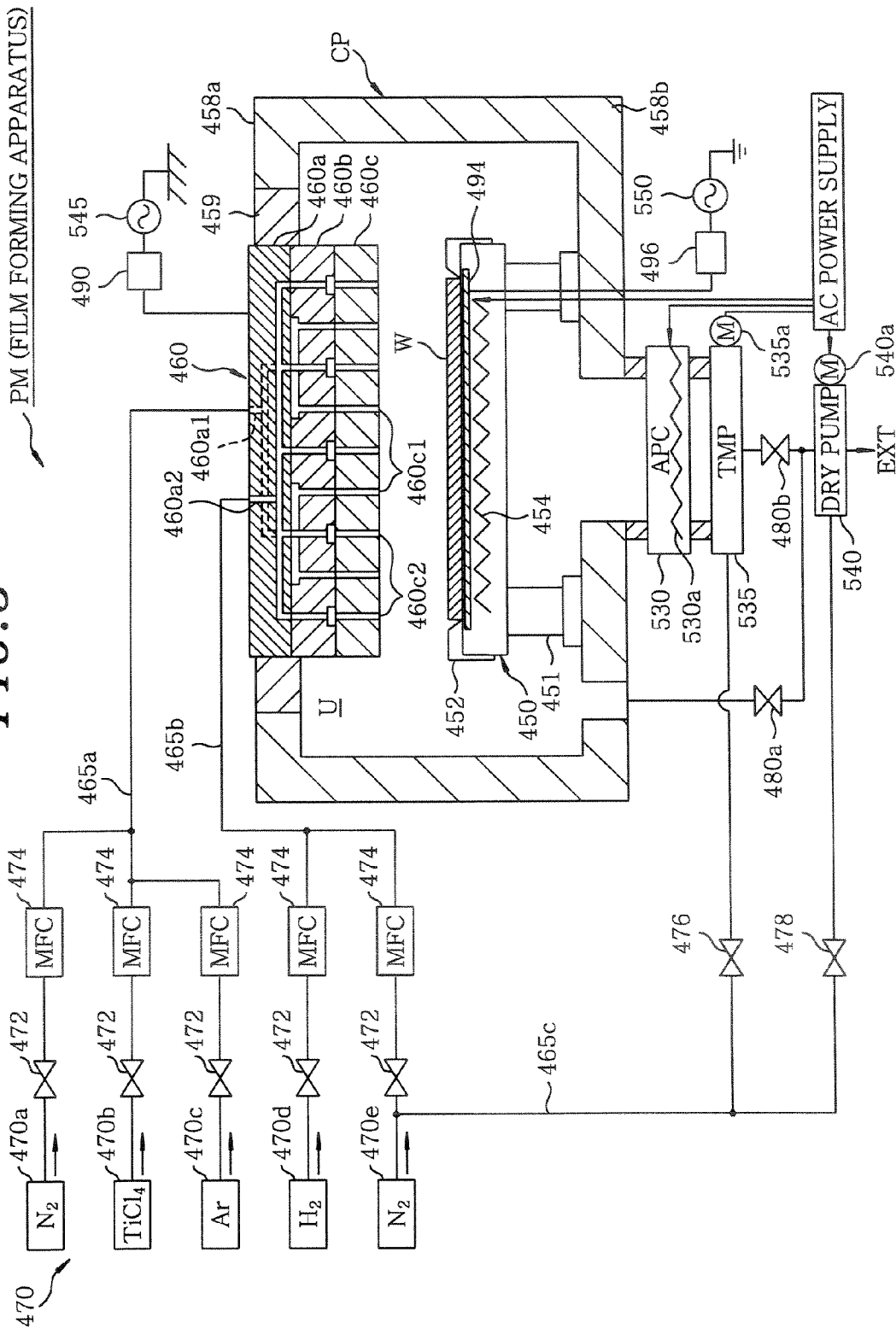
FIG. 5 is a vertical sectional view of a PM (film forming processing apparatus) in accordance with each embodiment of the present invention.

Further, when the actuator driving signal, in response to a control signal transmitted from the dry pump controller 260b1, is transmitted to the AC power supply 505 of FIG. 5 through the I/O port, a desired AC voltage is supplied from the AC power supply 505 according to the actuator driving signal, thereby controlling the number of rotation of a rotor (not shown) of the motor 540a of the dry pump 540 (including a hydrogen explosion-proof dry pump). Thereby, the dry pump controller 260b1 controls the number of rotation or the stoppage and restart of the dry pump 540.

Further, the hydrogen explosion-proof dry pump is provided to avoid the danger of explosion of hydrogen, which is combustible material, due to a leak and the like. The hydrogen explosion-proof dry pump is operated when hydrogen is supplied to the inside of the processing chamber U. The hydrogen explosion-proof dry pump may be provided separately from the dry pump 540, or may be same as the dry pump 540.

Further, when the actuator driving signal, in response to a control signal transmitted from the N₂ purge gas controller 260b2, is transmitted to at least one of the valve 476 and the valve 478 through the I/O port, the valve 476 or valve 478 is opened according to the actuator driving signal, so that the N₂ purge gas is supplied from the N₂ gas supply 470e to the TMP 535 or the dry pump 540. Thereby, the N₂ purge gas controller 260b2 controls the N₂ purge gas supplied to the TMP 535 or the dry pump 540.

Further, when the actuator driving signal, in response to a control signal transmitted from the heater temperature controller 260b3, is transmitted to the AC power supply 525 of FIG. 5 or FIG. 7 through the I/O port, a desired AC voltage is supplied from the AC power supply 525 according to the actuator driving signal, thereby controlling the temperatures of the heaters 580a, 580b and 580c respectively installed in the sidewalls and the shower head 460 (upper electrode) of FIG. 7, the heater 454 installed in the mounting table 450 (lower electrode), and the heater 530a installed in the APC 530. Thereby, the heater temperature controller 260b3 controls the temperature of each heater.

Further, when the actuator driving signal, in response to a control signal transmitted from the chiller flow rate controller 260b4, is transmitted to the coolant supply source 570 of FIG. 7 through the I/O port, a specific amount of medium supplied from the coolant supply source 570 circulates through the conduit path 570a according to the actuator driving signal, thereby controlling the temperature of the temperature controller 455 in the mounting table 450 and the temperature of the upper electrode. Thereby, the chiller flow rate controller 260b4 controls the temperature of the temperature controller 455 and the temperature of the upper electrode.

Further, when the actuator driving signal, in response to a control signal transmitted from the PM power supply controller 260b5, is transmitted to the power supply SW 500 in each PM of FIG. 3 through the I/O port, the power supply SW 500 is turned on and off according to the actuator driving signal, thereby connecting and disconnecting the main power of each of the PM1, PM2, PM3 and PM4. Thereby, the PM power supply controller 260b5 controls the power supply SW 500.

The unit selection section 265 instructs the unit controller 260 to control a selected unit by a selected energy saving mode. For example, when the input section 255 inputs the information, according to a manipulation of the operator, that a flow rate of the chiller in the coolant supply source 570 is to be controlled as the power-down mode, the unit selection section 265 selects the chiller flow rate controller 260b4, and instructs the unit controller 260 to control the chiller flow rate controller 260b4 in the power-down mode. Alternatively, instead of selecting a unit in response to an instruction of the operator (user), the unit selection section 265 may automatically select a unit, and instruct the unit controller 260 to control the selected unit in a selected energy saving mode.

Here, it is also possible, for example, to classify the units into any one of the power-down mode (the first energy saving mode), the pause mode (the second energy saving mode) and the inactive mode (the third energy saving mode), based on a time width for each unit to be stabilized in the energy saving mode. In this case, the information about the classification may be registered in the database 250 in advancer and the unit selection section 265 may automatically select, based on the information about the classification, a unit belonging to the selected energy saving mode.

For example, when the power-down mode is selected, the unit controller 260 may control at least any one of the following, based on the information about the classification stored in the database 250: the number of rotation of the exhaust system unit; the supply of the purge gas from the gas supply unit to the exhaust system unit; and the flow rate of the medium supplied from the cooling unit.

Further, if the pause mode is selected, in addition to the controls of units performed in case of the power-down mode, the unit controller 260 may further perform at least any one of the following, based on the information about the classification stored in the database 250: the temperature control of the temperature control unit, the supply control of the purge gas supplied from the gas supply unit to the substrate processing apparatus; and the control of the stoppage and restart of the exhaust system unit.

Further, if the inactive mode is selected, the unit controller 260 may control the connection and disconnection of the power supply unit of the corresponding PM, based on the information about the classification stored in the database 250.

The energy saving start timer 285*a* measures the time from a start of the energy saving process (the present point of time) to a start of the transition to the energy saving mode (i.e., an energy saving mode transition time Ts). Accordingly, if the energy saving mode transition time Ts is set to be 0, the transition to the energy saving mode is started without delay.

The energy saving end timer 285*b* measures the time from the completion of the transition to the energy saving mode to the start of the return from the energy saving mode (i.e., an energy saving mode return time Te), which is equivalent to the time during which the energy saving is performed.

The management section 270 manages the timing when the unit controller 260 starts the transition of the unit selected by the unit selection section 265 from the normal mode to the energy saving mode, by using the energy saving start timer 285*a* based on the energy saving mode transition time A and the energy saving mode return time B that are stored in the data base 250. Further, the management section 270 also manages the timing when the unit controller 260 starts the return from the energy saving mode to the normal mode, by using the energy saving end timer 285*b*.

Before starting the transition from the normal mode to the energy saving mode and after completing the return from the energy saving mode to the normal mode, the setup section 275 automatically executes a setup process such as checking of the operation in the PM and the like. The setup process includes a preparation process for proceeding to the energy saving mode. The substrate processing control section 280 performs the controls for the film forming process or the etching process on the wafer W transferred into the PM.

Upon receiving a command from the unit controller 260, the communication section 290 transmits to the MC 300 a control signal for a selected unit to proceed to the energy saving mode. Further, the communication section 290 also transmits to the MC 300 a control signal for the return from the energy saving mode. Thereby, the PM and the LLM come into energy saving states in which energy consumption is restrained for a specific time controlled by the management section 270.

Further, upon receiving a command from the setup section 275, the communication section 290 transmits to the MC 300 a control signal to execute the setup process in the PM. Thus, for example, even after the PM or the LLM are cleaned by hand, or each unit is controlled as the energy saving mode within the range which influences on the condition in the PM or the LLM, the checking of the operation of each unit in the PM or the checking of the process by using a dummy wafer are automatically performed according to a recipe in which a series of processes are automatically programmed. Thus, the condition in the PM is automatically controlled.

Further, upon receiving a command from the substrate processing control section 280, the communication section 290 transmits to the MC 300 a control signal to control the PM 400. Thereby, the wafer in the PM 400 is processed according to a process recipe. When a problematic matter occurs during each process, the output section 295 sends a warning to the operator by displaying the matter, e.g., on the monitor 715, or outputs necessary information related thereto.

Further, the above-described functions of the EC 200 are implemented by the CPU 215 executing the program representing a process sequence for realizing the functions, or controlling an IC (not shown) or the like for realizing the functions. For example, in accordance with the present embodiment, the functions of the unit selection section 265, the management section 270, the setup section 275 and the substrate processing control section 280 are realized by the CPU 215 executing the program or recipe that represents the process sequence for realizing the functions.

(Operation of EC)

Figure 10:
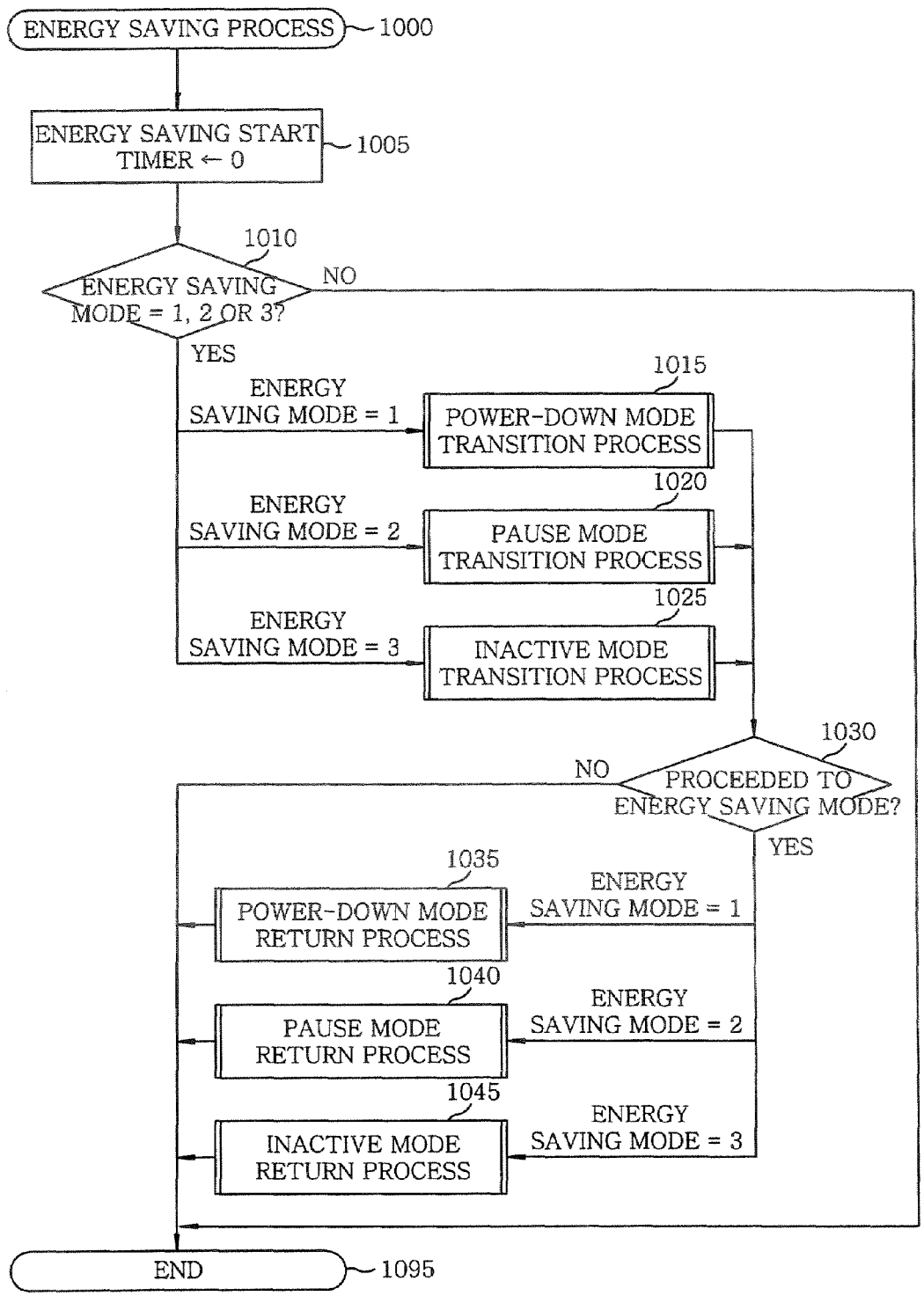
FIG. 10 is a flow chart of an energy saving process routine in accordance with each embodiment of the present invention.
Figure 11:
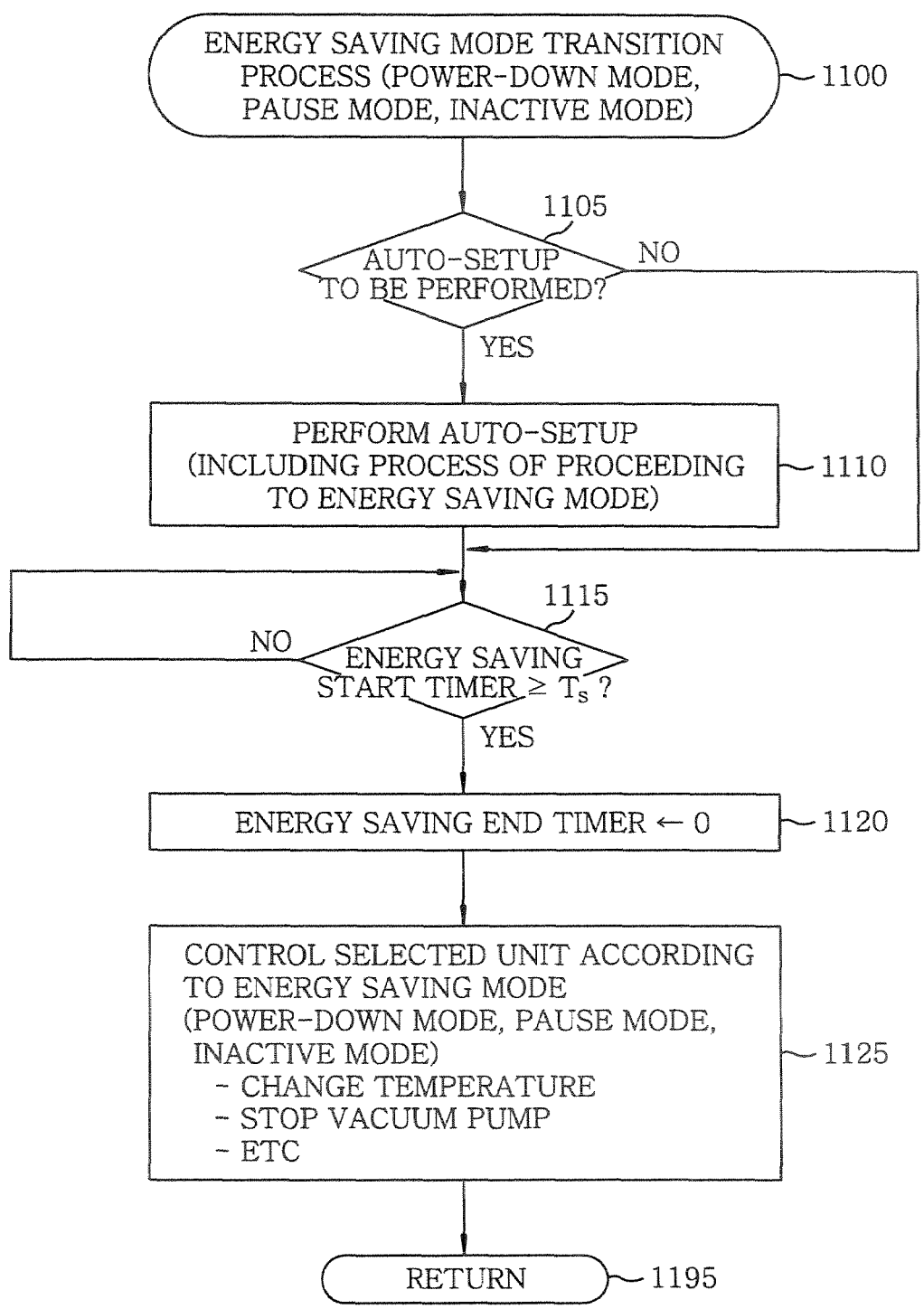
FIG. 11 is a flow chart of an energy saving transition routine in accordance with the first and second embodiments of the present invention.
Figure 12:
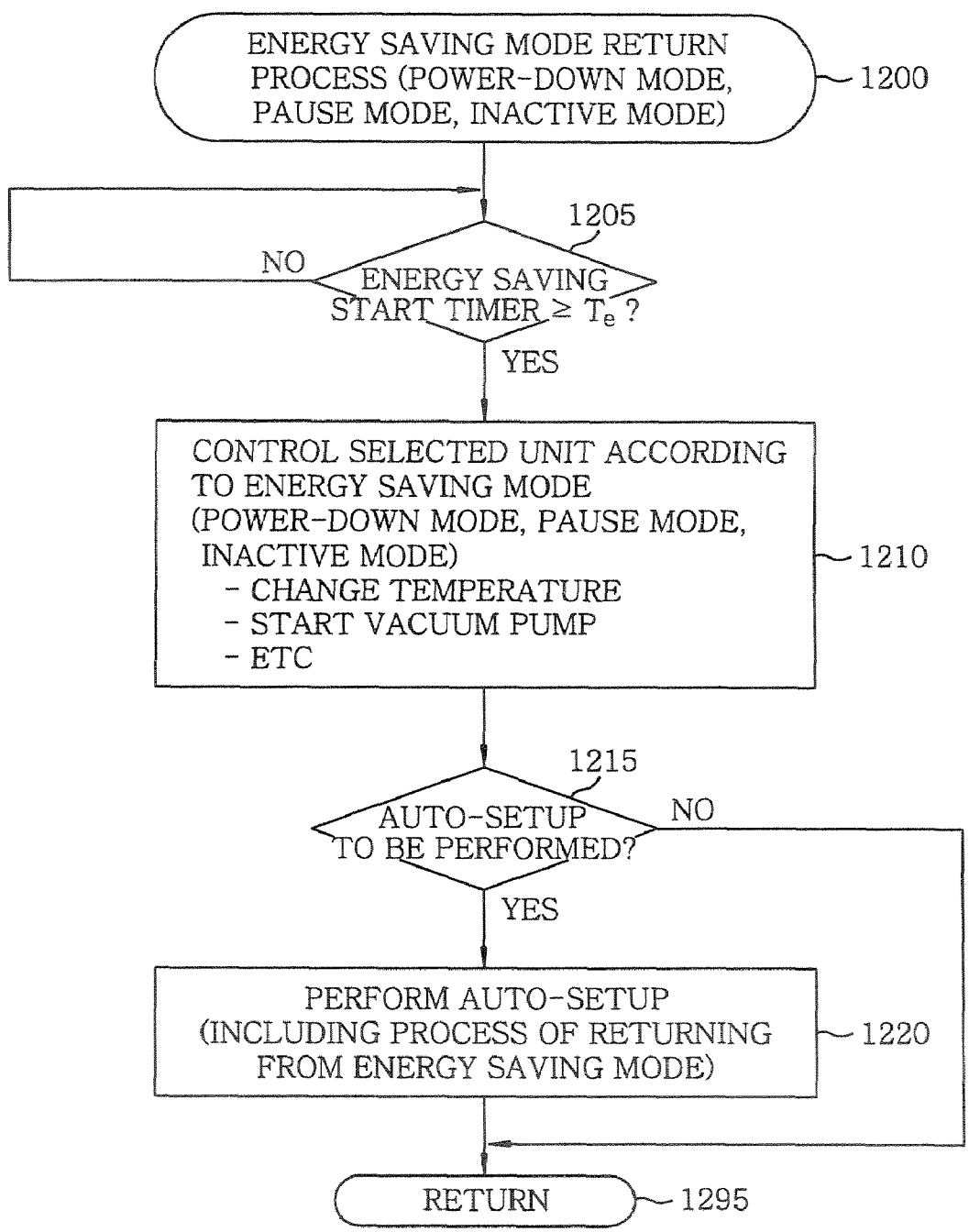
FIG. 12 is a flow chart of an energy saving return routine in accordance with the first and third embodiments of the present invention.

Hereinafter, the operation of the EC 200 will be described with reference to FIGS. 10 to 12. FIG. 10 is a flow chart illustrating an energy saving process (main routine) performed by the EC 200; FIG. 11 is a flow chart illustrating an energy saving mode transition process (a power-down mode transition process, a pause mode transition process and an inactive mode transition process) used in the main routine of FIG. 10; and FIG. 12 is a flow chart illustrating an energy saving mode return process (a power-down mode return process, a pause mode return process and an inactive mode return process) used in the main routine of FIG. 10.

Further, before the energy saving process is started, the time Ts from the start of the energy saving process (the present point of time) to the start of the transition to the energy saving mode, and the time from the start of the return from the energy saving mode to the normal mode (i.e., the energy saving mode return time Te) are set in advance. Further, in the energy saving mode, the power-down mode is designated as '1', the pause mode is designated as '2', and the inactive mode is designated as '3'.

(Energy Saving Process)

When an operator turns on an energy saving start button (or automatically after a process of a lot is completed), the energy saving process is started in step 1000 of FIG. 10; and, in step 1005, the management section 270 sets the energy saving start timer 285*a* to be 0.

Thereafter, in step 1010, the management section 270 determines any one of '1', '2', and '3' as a designated energy saving mode. If the energy saving mode is '1', the procedure moves on to the power-down mode transition process in step 1015; if the energy saving mode is '2', the procedure moves on to the pause mode transition process in step 1020; and if the energy saving mode is '3', the procedure moves on to the inactive mode transition process.

(Energy Saving Transition Process)

Each transition process is started from step 1100 of FIG. 11. In step 1105, the management section 270 determines whether or not to execute an auto-setup process. If the auto-setup process is determined to be performed, the setup section 275 executes in step 1110 the auto-setup process according to a series of recipes for setup. Then, the procedure moves on to step 1115. However, if the auto-setup process is determined not to be performed, the management section 270 starts step 1115 without delay.

In step 1115, the management section 270 determines whether or not the energy saving start timer 285*a* is greater than or equal to the energy saving mode transition time Ts. If the energy saving start timer 285*a* is greater than or equal to the energy saving mode transition time Ts (refer to FIG. 13), the procedure moves on to step 1120 so that the management section 270 sets the energy saving end timer 285 to be 0. Then, the procedure proceeds to step 1125.

In step 1125, the unit selection section 265 selects the unit controller 260 selected by the operator or selected automatically. The selected unit controller 260 controls a designated unit as a designated energy saving mode, and completes the process in step 1195.

When the energy saving transition process is completed, the procedure moves on to step 1030 of FIG. 10 so that the management section 270 verifies whether or not the designated unit has proceeded to the designated energy saving mode. In this point of time, since the designated unit has proceeded to the energy saving mode, the management section 270 determines as 'YES'. Then, if the energy saving mode is '1', the management section 270 starts the power-down mode return process of step 1035; if the energy saving mode is '2', the management section 270 starts the pause mode return process of step 1040; and if the energy saving mode is '3', the management section 270 starts the inactive mode return process of step 1045.

(Energy Saving Return Process)

Each return process is started from step 1200 of FIG. 12. In step 1205, the management section 270 determines whether or not the energy saving end timer 285b is greater than or equal to the energy saving mode return time Te. If the energy saving end timer 285b is greater than or equal to the energy saving mode return time Te, the management section 270 starts step 1210. In step 1210, the unit selection section 265 controls the designated unit to return from the designated energy saving mode; and then, the procedure moves on to step 1215.

In step 1215, the management section 270 determines whether or not to execute the auto-setup process. If the auto-setup process is determined to be performed, the setup section 275 starts step 1220 to execute the auto-setup process according to a series of recipes; and then, the procedure moves on to step 1295 to complete the energy saving return process. However, if the auto-setup process is determined not to be performed, the management section 270 starts step 1295 without delay to complete the energy saving return process. Thereby, the energy saving process in step 1095 of FIG. 10 is ended.

Figure 13:
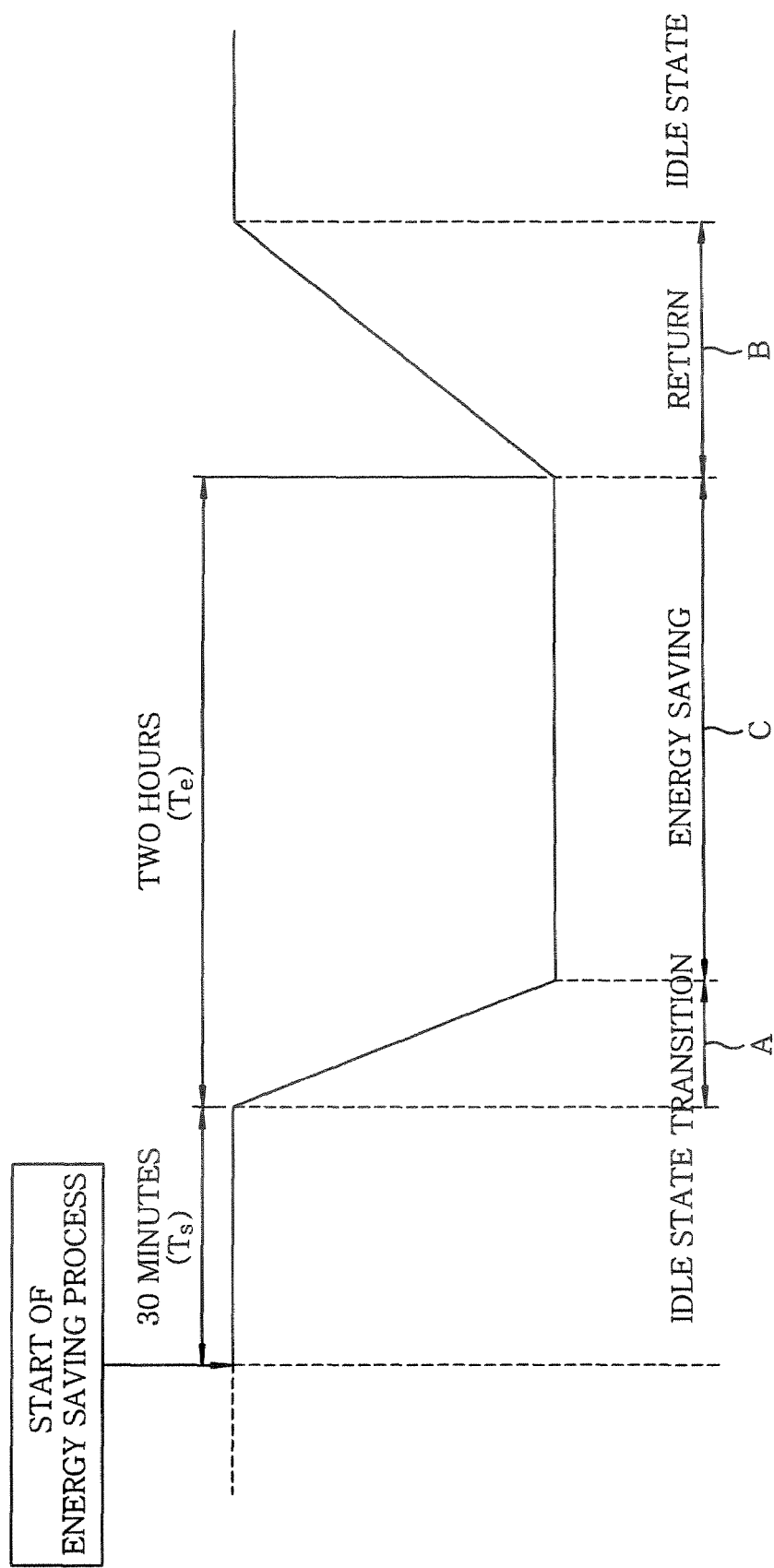
FIG. 13 is a view for explaining an exemplary energy saving state in accordance with the first embodiment.

In accordance with the energy saving process of the present embodiment, as illustrated in FIG. 13, for example, if the energy saving mode transition time Ts is 30 minutes, and the energy saving mode return time Te is 2 hours, the inside of the PM is maintained in the idle state for 30 minutes from the start of the energy saving process. Thereafter, the energy saving mode is automatically started. After the energy saving mode transition time A of each unit is ended, the inside of the PM comes into the energy saving state for a specific time C. Then, after two hours has elapsed from the start of the transition to the energy saving mode, the return from the energy saving mode is automatically started. After the energy saving mode return time B of each unit is ended, the inside of the PM is returned to the idle state.

Thus, even in case a considerable amount of time is required to return from the energy saving mode to the normal mode, the condition inside the processing chamber U can be accurately adjusted when returning from the energy saving mode to the normal mode (idle state).

Specifically, in a PM of a vacuum type in which plasma is generated by ionizing and/or dissociating gas by a high frequency power and the wafer W is processed by the plasma, a desired process on the wafer W can be performed by controlling motion of electrons, ions and radicals of the plasma with a high accuracy. To control the motion of electrons, ions and radicals of the plasma with a high accuracy, when the normal mode is returned from the energy saving mode, it is very important to adjust the condition in the processing chamber and control the timings until the return of the mode.

Considering the aforementioned points, to achieve energy saving and control the condition inside the processing chamber at proper timings by the present embodiment, data accumulated from the past is stored in the database 250 in advance, and an accurate time control is performed by using various timers. Thereby, the energy, which would be unnecessarily consumed in the idle state of the PM in the conventional case, is saved, and the condition in the processing chamber U is accurately controlled to meet processing requirements when wafers are processed.

Second Embodiment

Hereinafter, a substrate processing system 10 according to a second embodiment of the present invention will be described. The substrate processing system 10 of the second embodiment is different from the substrate processing system 10 of the first embodiment as following: the former controls the time from the transition of the energy saving mode to the end of the return from the energy saving mode, whereas the latter controls the time from the transition to the energy saving mode to the start of the return from the energy saving mode. Thus, focusing on this difference, the operation of EC 200 in the substrate processing system 10 according to the second embodiment will be described with reference to FIG. 14.

(Operation of EC)

Figure 14:
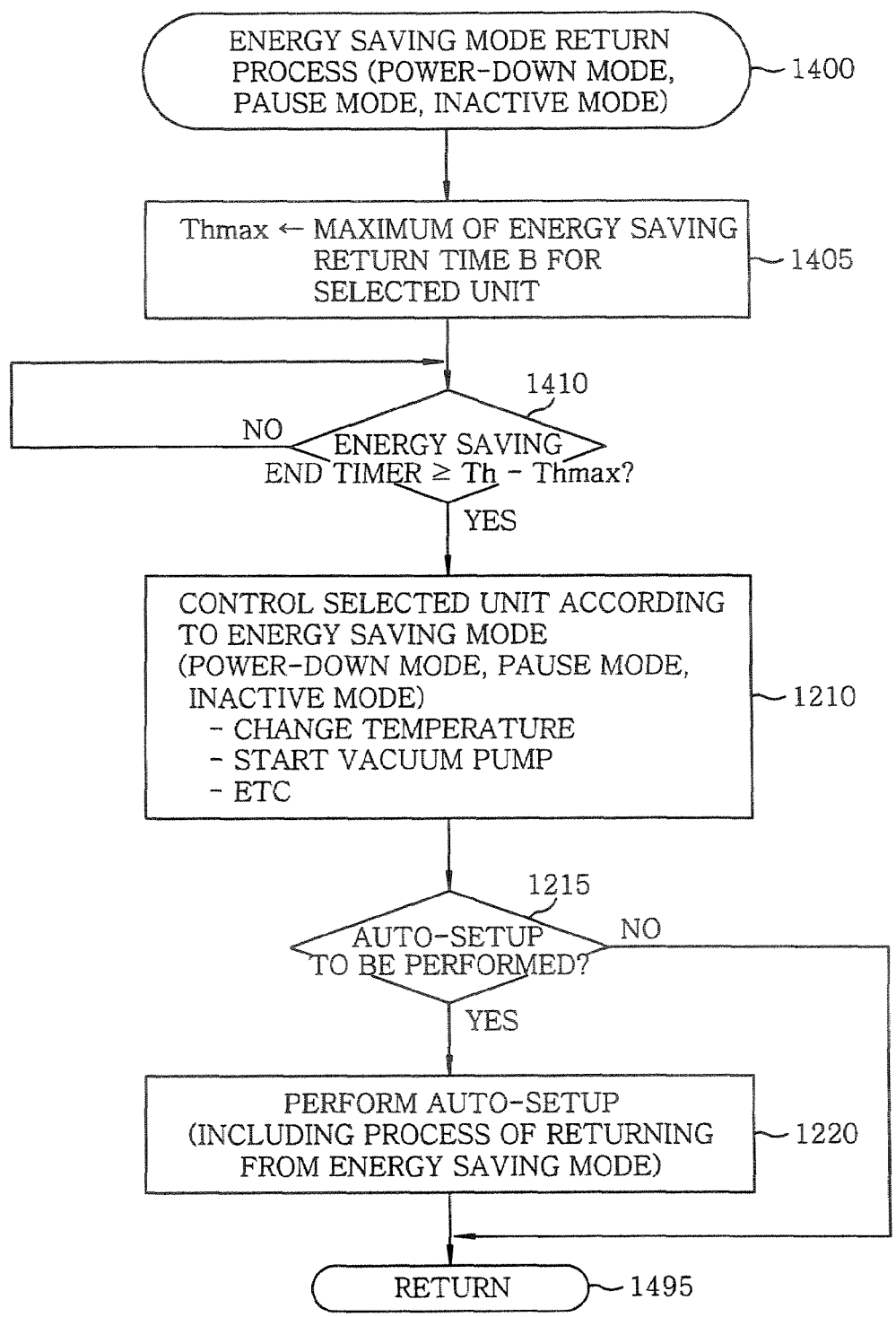
FIG. 14 is a flow chart of an energy saving return routine in accordance with the second embodiment.

FIG. 14 is a flow chart illustrating a process of returning from the energy saving mode (process of returning from the power-down mode, process of returning from the pause mode, process of returning from the inactive mode) of the second embodiment, which is applied to the steps 1035, 1040 and 1045 of the energy saving process (main routine) of FIG. 10.

Further, before the energy saving process is started, the energy saving mode transition time Ts, and the time Th are set in advance. Herein, the time Th amounts to a time from the transition to the energy saving mode to the end of the return from the energy saving mode.

(Energy Saving Process)

When the operator turns on the energy saving start button (or when the energy saving start button is automatically turned on after a process of a lot is ended), the energy saving process is started from step 1000 of FIG. 10. Thereafter, in steps 1005, 1010, 1015, 1020 and 1025, the energy saving transition process of FIG. 11 is executed. In case of 'YES' in step 1030, the energy saving return process is executed in steps 1035, 1040 and 1045.

(Process of Restoring Normal Mode from Energy Saving Mode)

Each return process is started from step 1400 of FIG. 14. In step 1405, the management section 270 sets the maximum value of the energy saving return time B of each of the units selected by the unit selection section 265 to be Thmax (refer to FIG. 15) among the energy saving return time B stored in the database 250. Then, the procedure proceeds to step 1410.

In step 1410, the management section 270 determines whether or not the energy saving end timer 285b is greater than or equal to Th−Thmax. If it is determined that the energy saving end timer 285b is greater than or equal to Th−Thmax, the management section 270 starts step 1210 so that the unit controller 260 of each of the units selected by the unit selection section 265 controls each unit to be returned from the energy saving mode. Then, the procedure moves on to step 1215.

Then, each unit controller 260 controls the timing for returning to the idle state such that each unit is maintained in the energy saving state as long as possible. For example, if the units selected by the unit selection section 265 are the dry pump controller 260b1, the $N_2$ purge gas controller 260b2 and the chiller flow rate controller 260b4 of FIG. 8, the energy saving return times B for the restart control of the dry pump by the dry pump controller 250b1, the restart control of diluted $N_2$ purge gas by the $N_2$ purge gas controller 260b2, and the control for the chiller flow rate of the coolant supply source by the chiller flow rate controller 260b4 are 10 seconds, 1 to 2 seconds, and 4 to 5 seconds, respectively (see FIG. 9). Accordingly, in step 1405, Thmax is set to be 10 seconds. In FIG. 15, a unit a (which corresponds to the restart control of the dry pump by the dry pump controller 260b1) starts an operation of returning from the energy saving mode at the timing of 10 seconds before the end of the return. Subsequently, a unit b (which corresponds to the control for the chiller flow rate of the coolant supply source by the chiller flow rate controller 260b4) starts an operation of the return from the energy saving mode at 5 seconds before the end of the return. A unit c (which corresponds to the restart control of the diluted $N_2$ purge gas by the $N_2$ purge gas controller 260b2) starts an operation of the return from the energy saving mode at 2 seconds before the return is ended.

Further, when the return process is executed for the first time, the unit controller 260 starts the return at a timing that has been set in advance, because no actual value is stored in the database 250.

Thereafter, in step 1215, the management section 270 determines whether or not the auto-setup process is to be executed. After the auto-setup process is executed in step 1220 (or skipping the auto-setup process of step 1220), the management section 270 starts step 1495 to complete the energy saving return process. Then, in step 1095 of FIG. 10, the energy saving process is completed.

In accordance with the energy saving process of the present embodiment, each selected unit is controlled to be maintained in the energy saving state as long as possible, considering the actual time in the energy saving mode process together with the time for returning from the energy saving mode. Thereby, the condition in the processing chamber U is accurately controlled, and the energy consumption of each unit is most efficiently reduced.

Third Embodiment

Hereinafter, a substrate processing system 10 according to a third embodiment of the present invention will be described. The substrate processing system 10 of the third embodiment is different from the substrate processing system 10 of the second embodiment as following: in the former, when each selected unit meets a specific condition, no energy saving process is executed for the unit; in the latter, the energy saving process is executed for the selected unit without exception. In the following, the operation of EC 200 in the substrate processing system 10 according to the third embodiment will be described with reference to FIGS. 16A and 16B by focusing on the above difference.

(Operation of EC)

Figure 16A:
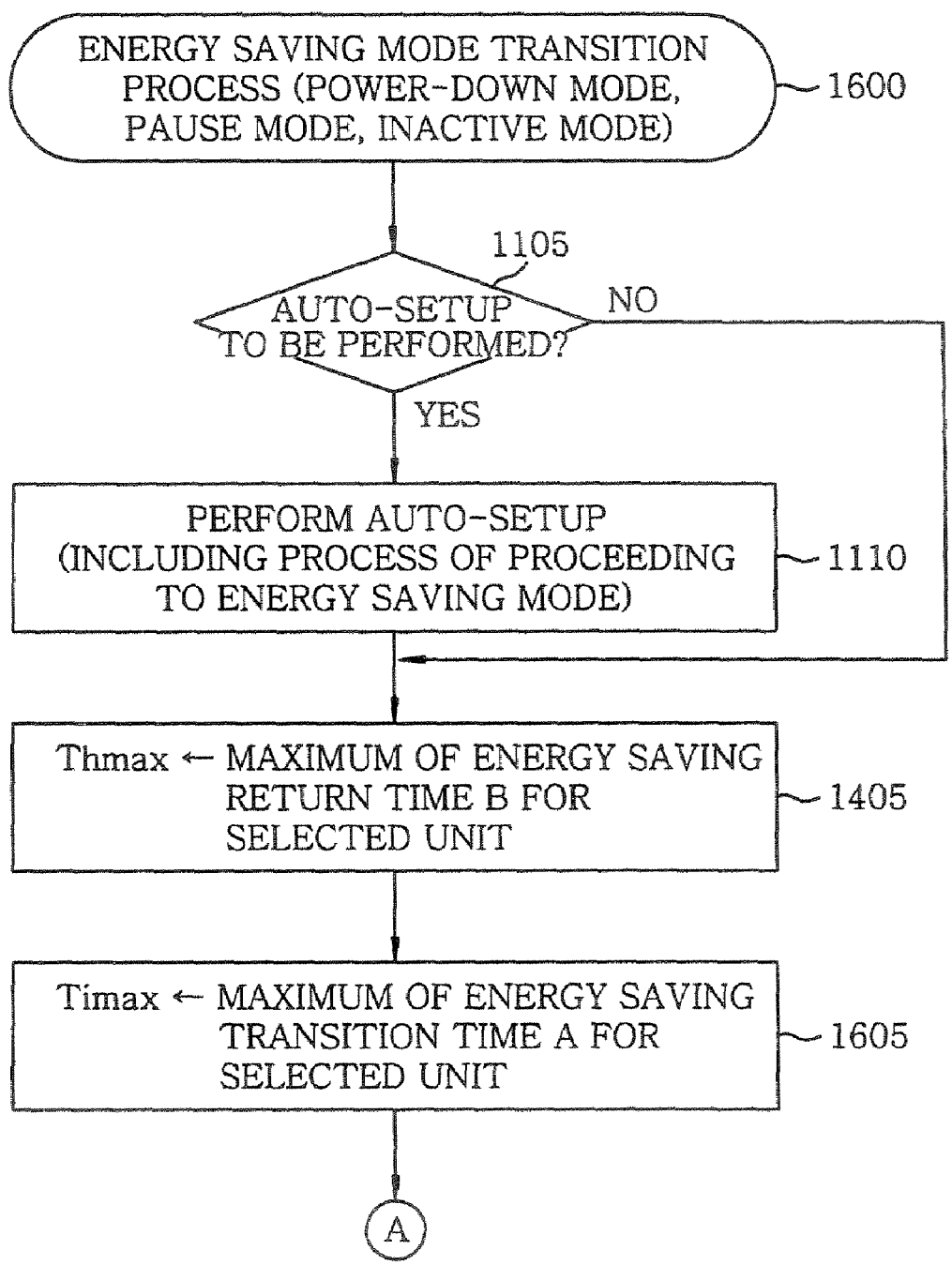
FIGS. 16A and 16B are flow charts of an energy saving transition routine in accordance with the third embodiment.
Figure 16B:
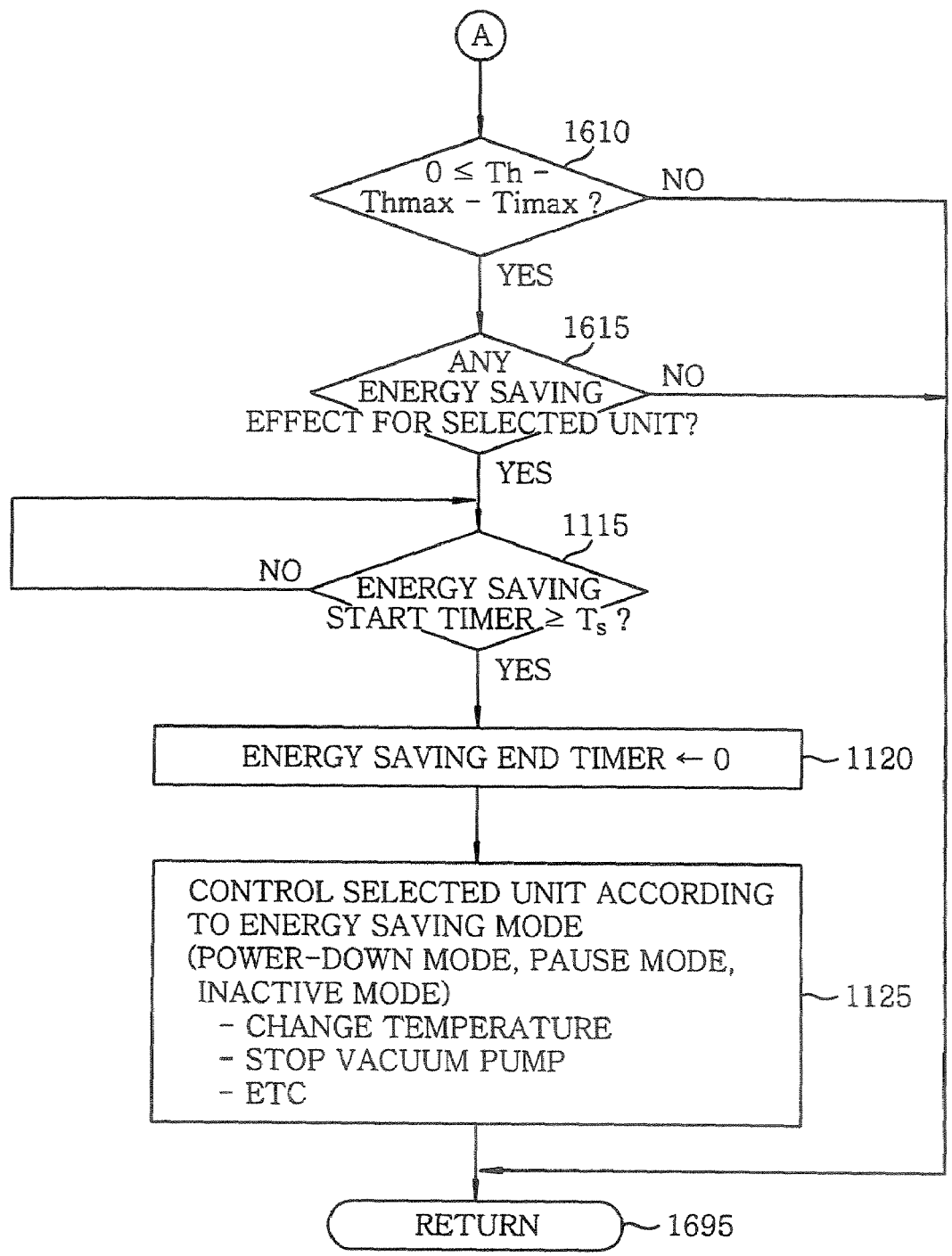

FIGS. 16A and 16B are flow charts illustrating the energy saving mode transition process (the power-down mode transition process, the pause mode transition process, and the inactive mode transition process) used in the energy saving process (main routine) of FIG. 10.

Further, like the second embodiment, the energy saving mode transition time Ts and the time Th for completing the return from the energy saving mode are set in advance before the energy saving process is started.

(Energy Saving Process)

When the operator turns on the energy saving start button (or when the energy saving start button is automatically turned on after a process of a lot is ended), the energy saving process is started from step 1000 of FIG. 10. Then, the energy saving transition process of FIGS. 16A and 16B is executed in step 1005, 1010, 1015, 1020 and 1025.

(Process of Performing Energy Saving)

Each transition process is started from step 1600 of FIGS. 16A and 16B. In steps 1105 and 1110, the auto-setup process is executed. In step 1405, the management section 270 sets the maximum value of the energy saving return time B of each unit selected by the unit selection section 265 to be Thmax, among the energy saving return time B stored in the database 250. Thereafter, the procedure moves on to step 1605.

Next, the management section 270 sets the maximum value of the energy saving transition time A of each unit selected by the unit selection section 265 to be Timax, among the energy saving transition time A stored in the database 250. Then, the procedure proceeds to step 1610. Here, if a value obtained by subtracting Thmax and Timax from Th (i.e., the value of Th−Thmax−Timax) is less than or equal to 0 the time C for stabilizing energy saving does not exist as shown in FIG. 15 (refer to FIG. 15). In this case, the management section 270 determines that no sufficient energy saving effect is obtained by performing the energy saving mode. Accordingly, in step 1610, the management section 270 determines 'NO', and starts step 1695 without performing the energy saving transition process to return the procedure to step 1030 of FIG. 10. Further, in this case, since the procedure does not proceed to the energy saving mode, the management section 270 determines 'NO' in step 1030, and starts step 1695 without performing the energy saving transition process, thereby ending the energy saving process.

However, the value obtained by subtracting Thmax and Timax from Th (i.e., the value of Th−Thmax−Timax) is greater than 0, the time C for stabilizing energy saving does not exist as shown in FIG. 15. In this case, in step 610 the management section 270 determines 'YES', and starts step 1615 so that the unit controller 260 determines whether or not an energy saving effect is achieved in each selected unit.

Whether or not an energy saving effect is achieved in each selected unit is determined by using, although not shown in the drawings, an amount of power consumed for restarting each unit that has been previously stored in a memory such as the database 250 or RAM 210. That is, the unit controller 260 determines whether or not to proceed to the energy saving mode in each selected unit, based on the relationship between the amount of power consumed for restarting each unit and the time C for stabilizing energy saving. The power consumption (energy consumption) which each unit uses upon restart is compared to the energy consumption which is saved in the stabilized energy saving state for the time C for stabilizing energy saving. Based on this comparison, the energy saving mode is performed only when the energy saving is greater than the energy consumption.

In this manner, if the unit controller 260 determines that the energy saving effect has been achieved, the unit controller 260 starts step 1115. When the energy saving start timer 285a is greater than or equal to the energy saving mode transition time Ts, in step 1125 following step 1120, the unit controller 260 controls each selected unit to be performed as the designated energy saving mode. Then, in step 1695, the energy saving process is ended, returning to step 1030 of FIG. 10.

However, if the unit controller 260 determines that no energy saving effect has been achieved, the unit controller 260 determines 'NO' in step 1615, and starts step 1695 without delay, thereby finishing the energy saving transition process. Then, the procedure returns to step 1030 of FIG. 10.

The management section 270 determines 'YES' in step 1030 only when the procedure has proceeded to the energy saving mode, and executes the energy saving return process of any one of steps 1035, 1040 and 1045. Then, the procedure moves on to step 1095. However, when the procedure has not proceeded to the energy saving mode, the management section 270 starts step 1095 without delay, thereby ending the energy saving progress.

In accordance with the energy saving process in the present embodiment, it is determined whether or not the energy saving mode is to be performed for each selected unit, based on the relationship of the amount of power consumed for restarting each unit and the calculated time C for stabilizing energy saving. As a result, the unit having the energy saving effect is controlled to proceed to the energy saving mode, whereas the unit having no energy saving effect is controlled as the normal mode. By controlling only the unit having the energy saving effect to proceed to the energy saving mode, the energy consumption can be reduced more efficiently. Further, by controlling the unit having no energy saving effect as the normal mode, the condition in the PM 400 can be protected from being carelessly changed. Since the condition in the PM 400 is prevented from being carelessly changed, a synergistic effect can be achieved in that the return time of the unit that has proceeded to the energy saving mode can be shortened. Thus, the energy consumption can be further reduced.

In the above, whether or not the energy saving effect has been achieved was determined by using the relationship between the amount of power consumed for restarting each unit and the calculated time C for stabilizing energy saving. However, in order to control the temperature of the heaters in the upper/lower electrodes and sidewalls, the temperature of the heater in the APC, and the temperature of the heater in the mounting table, the energy saving temperature Ta when updating data (when updating the energy saving mode transition time A and the energy saving mode return time B), together with the return temperature Tb when updating data, need be considered in addition to the time C for stabilizing energy saving, which is calculated based on the energy saving mode transition time A and the energy saving mode return time B. For example, in the control of temperature of the heaters in the upper/lower electrodes and sidewalls, a difference between the energy saving temperature Ta when updating data and the return temperature Tb when updating data is 20° C. Therefore, to stabilize the temperature in the processing chamber U after the return at a specific temperature (in this case, 60° C.), it is supposed to take a longer time for the return, compared to the energy saving mode return time B in normal cases. In this regard, the unit controller 260 may determine whether or not each unit for executing a temperature control has the energy saving effect, by considering the above-mentioned difference between the temperatures as set, in addition to the amount of power consumed for restarting each unit and the calculated time C for stabilizing energy saving.

Further, if the time for stabilizing the energy saving mode is 0 or less in step 1610, the energy saving process is ended without controlling the selected unit as the designated energy saving mode. However, the present invention is not limited thereto, and the procedure may also be configured such that, if the time for stabilizing the energy saving mode is less than or equal to a predetermined amount other than 0 in step 1610, the energy saving process is ended without controlling the selected unit as the designated energy saving mode.

Further, in the energy saving process according to each of the embodiments described above, after the auto-setup process is executed, it is determined whether or not the energy saving start timer 285a is greater than or equal to the energy saving mode transition time Ts. When the energy saving start timer 285a is greater than or equal to the energy saving mode transition time Ts, the energy saving mode transition process is executed (see FIGS. 11 and 16) However, the present invention is not limited thereto. Alternatively, for example, the auto-setup process may be executed when the energy saving start timer 285a is determined to be greater than or equal to the energy saving mode transition time Ts; and the energy saving mode transition process may be executed thereafter.

Further, in the auto-setup process, the contents of the auto-setup process may be changed by selection of the operator. Thus, the energy saving transition process and the energy saving return process may be set to have different contents. In this regard, the setup unit 275 may measure the elapsed time of the auto-setup process, and use the elapsed time to control the energy saving return time.

In the above embodiments, the operation of each element is correlated. Considering the correlation of the elements, the elements may be converted into a series of operations. In this manner, for example, the controller for controlling the substrate process equipment (PM) may be converted into a method for controlling the substrate process equipment.

Further, the operations of each element may be converted into a program by interpreting the operations of each element as processes of the program. Further, by storing the program in a computer-readable storage medium, the program may be converted into a computer-readable storage medium.

Although the present invention has been described with respect to the preferred embodiments by referring to the accompanying drawings, the present invention is not limited thereto. It is clear that those skilled in the art can make various changes and modifications may be made without departing from the scope of the invention as defined in the following claims, and these changes and modifications should be construed to be within the scope of the present invention For example, the type of the substrate processing apparatus in accordance with the present invention is not limited to that described above, and may be a capacitively coupled plasma processing apparatus, an inductively coupled plasma processing apparatus, or a microwave plasma processing apparatus. Further, the substrate processing apparatus of the present invention may be an apparatus for processing a large glass plate or an apparatus for processing a substrate of a conventional wafer size.

Further, the substrate processing apparatus of the present invention is not limited to the film forming process or the etching process, but may perform all kinds of substrate processes, such as a thermal diffusion process, an ashing process, a sputtering process, and the like.

Furthermore, the function of the equipment controller of the present invention may be realized by at least either the EC 200 or the MC 300.

While the invention has been shown and described with respect to the embodiments, it will be understood by those skilled in the art that various changes and modification may be made without departing from the scope of the invention as defined in the following claims.

What is claimed is:

1. A control device for controlling a substrate processing apparatus including a processing chamber for processing a substrate and a plurality of units for controlling a condition in the processing chamber, comprising:
   a storing device for storing a return time required for each unit to be returned from an energy saving mode, in which an energy consumption of each unit is restrained, to a normal mode, in which the substrate is capable of being processed;
   a management device for obtaining a return start timing for each unit to be returned from the energy saving mode to the normal mode, by estimating an amount of time required for each unit to be returned from the energy saving mode to the normal mode based on the return time of each unit stored in the storing device; and
   a unit controller for independently controlling each unit to be returned from the energy saving mode to the normal mode, based on the return start timing of each unit obtained by the management device.

2. The control device of claim 1, wherein the unit controller controls each unit to complete the return from the energy saving mode by a preset return end time, instead of controlling each unit by the return start timing obtained by the management device.

3. The control device of claim 1, wherein, among a first energy saving mode in which each unit is controlled to restrain an energy consumption thereof within a range that does not influence on a condition in the processing chamber, a second energy saving mode in which each unit is controlled to restrain the energy consumption thereof within a range that influences on the condition inside the processing chamber, and a third energy saving mode in which the whole units are stopped, the unit controller controls each unit to proceed one of the first, second and third energy saving modes selected by an operator or selected automatically.

4. The control device of claim 3, wherein the unit controller automatically selects one of the first, second and third energy saving modes, based on an amount of time required for each unit to be stabilized in the energy saving mode.

5. The control device of claim 3, wherein the storing device stores a transition time required for each unit to proceed from the normal mode to the energy saving mode,
   wherein the management device calculates an energy saving time during which each unit is stabilized in the energy saving mode, based on a time period from a timing at which a transition from the normal mode to the energy saving mode is started to a timing at which a return from the energy saving mode to the normal mode is completed, and the transition time and the return time stored in the storing device, and
   wherein, if the energy saving time for one or more of the units calculated by the management device is less than or equal to a specific time, or if one or more of the units is determined not to have any energy saving effect by the energy saving time, the unit controller controls said one or more of the units as the normal mode without controlling said one or more of the units as the energy saving mode.

6. The control device of claim 5; further comprising:
   a setup device for automatically setting up the substrate processing apparatus, before each unit starts to proceed from the normal mode to the energy saving mode and after each unit completes a return from the energy saving mode to the normal mode.

7. The control device of claim 3, wherein, if the first energy saving mode is selected, the unit controller performs at least any one of a control of the number of rotation of an exhaust system unit, a supply control of purge gas supplied from a gas supply unit to the exhaust system unit, and a flow rate control of a medium supplied from a cooling unit.

8. The control device of claim 7, wherein, if the second energy saving mode is selected, the unit controller performs, in addition to the controls performed if the first energy saving mode is selected, at least any one of a temperature control of a temperature control unit, a supply control of the purge gas supplied form the gas supply unit to the substrate processing apparatus, and a stoppage and restart control of the exhaust system unit.

9. The control device of claim 3, wherein, if the third energy saving mode is selected, the unit controller controls a connection and disconnection of a power supply unit of the substrate processing apparatus.

10. The control device of claim 3, wherein the control device controls a plurality of substrate processing apparatuses, and
    wherein the unit controller respectively controls each of the substrate processing apparatuses, such that a plurality of units provided in each of the substrate processing apparatuses are to proceed to one of the first, second and third energy saving modes selected by the operator or automatically per each of the substrate processing apparatuses.

11. The control device of claim 1, wherein the substrate processing apparatus includes a plurality of units for controlling a condition of an airtight chamber connected to the processing chamber, and
    wherein the unit controller controls the units disposed in the processing chamber and units disposed in the airtight chamber.

12. The control device of claim 1, wherein the substrate processing apparatus is a vacuum substrate processing apparatus.

13. A method of controlling a control device for a substrate processing apparatus including a processing chamber for processing a substrate and a plurality of units for controlling a condition in the processing chamber, comprising the steps of:
    storing a return time in a storing device, the return time being a time required for each unit to be returned from an energy saving mode, in which an energy consumption of each unit is restrained, to a normal mode, in which the substrate is capable of being processed;
    obtaining a return start timing for each unit to be returned from the energy saving mode to the normal mode, by estimating an amount of time required for each unit to be returned from the energy saving mode to the normal mode based on the return time of each unit stored in the storing device; and
    controlling independently each unit to be returned from the energy saving mode to the normal mode, based on the obtained return start time of each unit.

14. The method of claim 13, wherein the unit controller controls each unit to complete the return from the energy saving mode by a preset return end time, instead of controlling each unit by the obtained return start timing.

15. The method of claim 13, wherein a transition time is stored in the storing device, the transition time being a time required for each unit to proceed from the normal mode to the energy saving mode,
    wherein an energy saving time during which each unit is stabilized in the energy saving mode is calculated, based on a time period from a timing at which a transition from the normal mode to the energy saving mode is started to a timing at which a return from the energy saving mode to the normal mode is completed, and the transition time and the return time stored in the storing device, and wherein, if the calculated energy saving time for one or more of the units is less than or equal to a specific time, or if one or more of the units is determined not to have any energy saving effect by the energy saving time, the unit controller controls said one or more of the units as the normal mode without controlling said one or more of the units as the energy saving mode.

* * * * *